(12) United States Patent
Tega et al.

(10) Patent No.: US 10,290,704 B2
(45) Date of Patent: May 14, 2019

(54) SEMICONDUCTOR DEVICE AND METHOD FOR MANUFACTURING SAME, POWER CONVERSION DEVICE, THREE-PHASE MOTOR SYSTEM, AUTOMOBILE, AND RAILWAY CARRIAGE

(71) Applicant: HITACHI, LTD., Chiyoda-ku, Tokyo (JP)

(72) Inventors: Naoki Tega, Tokyo (JP); Naoki Watanabe, Tokyo (JP); Shintaroh Sato, Tokyo (JP)

(73) Assignee: HITACHI, LTD., Tokyo (JP)

( * ) Notice: Subject to any disclaimer, the term of this patent is extended or adjusted under 35 U.S.C. 154(b) by 72 days.

(21) Appl. No.: 15/533,964

(22) PCT Filed: Feb. 12, 2015

(86) PCT No.: PCT/JP2015/053726
§ 371 (c)(1),
(2) Date: Jun. 7, 2017

(87) PCT Pub. No.: WO2016/129068
PCT Pub. Date: Aug. 18, 2016

(65) Prior Publication Data
US 2018/0331174 A1 Nov. 15, 2018

(51) Int. Cl.
*H01L 29/06* (2006.01)
*H01L 29/12* (2006.01)
(Continued)

(52) U.S. Cl.
CPC ............ *H01L 29/063* (2013.01); *B60L 53/22* (2019.02); *H01L 21/049* (2013.01);
(Continued)

(58) Field of Classification Search
CPC ............ H01L 21/0495; H01L 29/0619; H01L 29/1608; H01L 29/41766; H01L 29/41775;
(Continued)

(56) References Cited

U.S. PATENT DOCUMENTS 8,283,721 B2 10/2012 Nakano
2003/0205758 A1 11/2003 Zeng
(Continued)

FOREIGN PATENT DOCUMENTS

JP 2005-524975 A 8/2005
JP 2009-260253 A 11/2009
(Continued)

*Primary Examiner* — Muhammad S Islam
(74) *Attorney, Agent, or Firm* — Miles & Stockbridge P.C.

(57) ABSTRACT

An object of the present invention is to provide high-performance highly-reliable power semiconductor device.
The semiconductor device according to the present invention is provided with a first conductive type semiconductor substrate, a drain electrode formed on a back side of the semiconductor substrate, a drift layer of the first conductive type formed on a surface side of the semiconductor substrate, a source area of the first conductive type, a current diffused layer of the first conductive type, a body layer of a second conductive type reverse to the first conductive type in contact with the source area and the current diffused layer, a trench which pierces the source area, the body layer and the current diffused layer, which is shallower than the body layer, and the bottom of which is in contact with the body layer, a high-concentration JFET layer of the first conductive type formed up to a deeper position than a boundary between the current diffused layer and the body layer, electrically connecting the drift layer and the current diffused layer, and having higher impurity concentration than the drift layer, a
(Continued)

gate insulating film formed on an inner wall of the trench, and a gate electrode formed on the gate insulating film.

15 Claims, 39 Drawing Sheets

(51) Int. Cl.
*H01L 29/66* (2006.01)
*H01L 29/16* (2006.01)
*H01L 21/04* (2006.01)
*H01L 29/10* (2006.01)
*H01L 29/78* (2006.01)
*H02M 7/5387* (2007.01)
*H02P 27/08* (2006.01)
*B60L 53/22* (2019.01)
*B61C 3/00* (2006.01)

(52) U.S. Cl.
CPC ......... *H01L 21/0465* (2013.01); *H01L 29/06* (2013.01); *H01L 29/0623* (2013.01); *H01L 29/1095* (2013.01); *H01L 29/12* (2013.01); *H01L 29/1608* (2013.01); *H01L 29/66068* (2013.01); *H01L 29/7811* (2013.01); *H01L 29/7813* (2013.01); *H02M 7/53871* (2013.01); *H02P 27/08* (2013.01); *B60L 2200/26* (2013.01); *B61C 3/00* (2013.01)

(58) Field of Classification Search
CPC ..... H01L 29/47; H01L 29/495; H01L 29/517; H01L 29/66068; H01L 29/66477; H01L 29/665; H01L 29/7395; H01L 29/78; H01L 29/7802; H01L 29/7811; H01L 29/7813; H01L 29/782; H01L 29/7839; H01L 29/872

See application file for complete search history.

(56) References Cited

U.S. PATENT DOCUMENTS

| | | | |
|---|---|---|---|
| 2008/0135925 A1* | 6/2008 | Takemori | H01L 29/66734 257/328 |
| 2010/0327654 A1* | 12/2010 | Azuma | B60L 11/04 307/9.1 |
| 2011/0291110 A1* | 12/2011 | Suzuki | H01L 29/0878 257/77 |
| 2012/0043606 A1 | 2/2012 | Sato et al. | |
| 2012/0319136 A1 | 12/2012 | Noborio et al. | |
| 2014/0103364 A1 | 4/2014 | Nakano et al. | |

FOREIGN PATENT DOCUMENTS

| | | |
|---|---|---|
| JP | 2012-043955 A | 3/2012 |
| JP | 2012-169386 A | 9/2012 |
| JP | 2012-191056 A | 10/2012 |
| JP | 2014-003051 A | 1/2014 |
| WO | WO 2010/110246 A1 | 9/2010 |

* cited by examiner

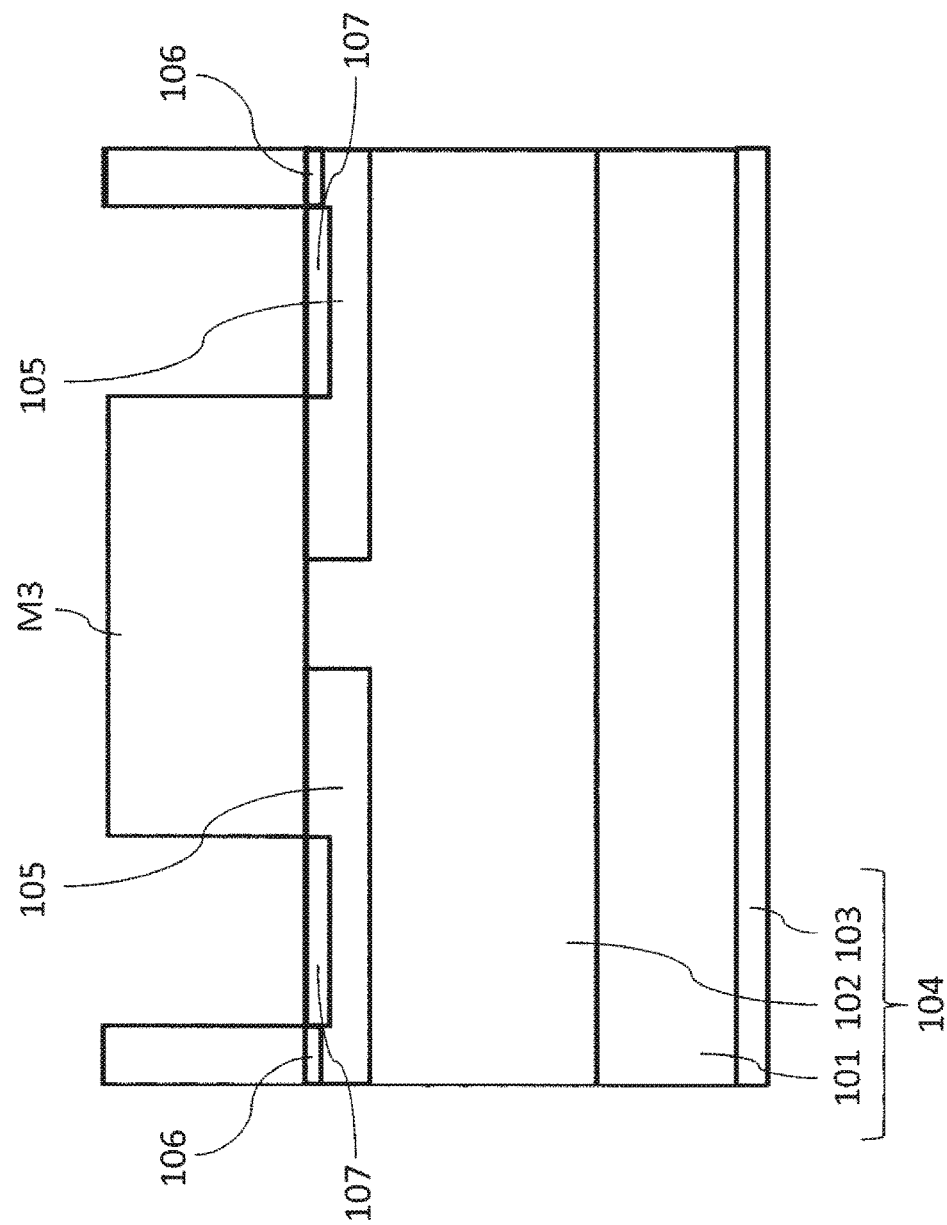

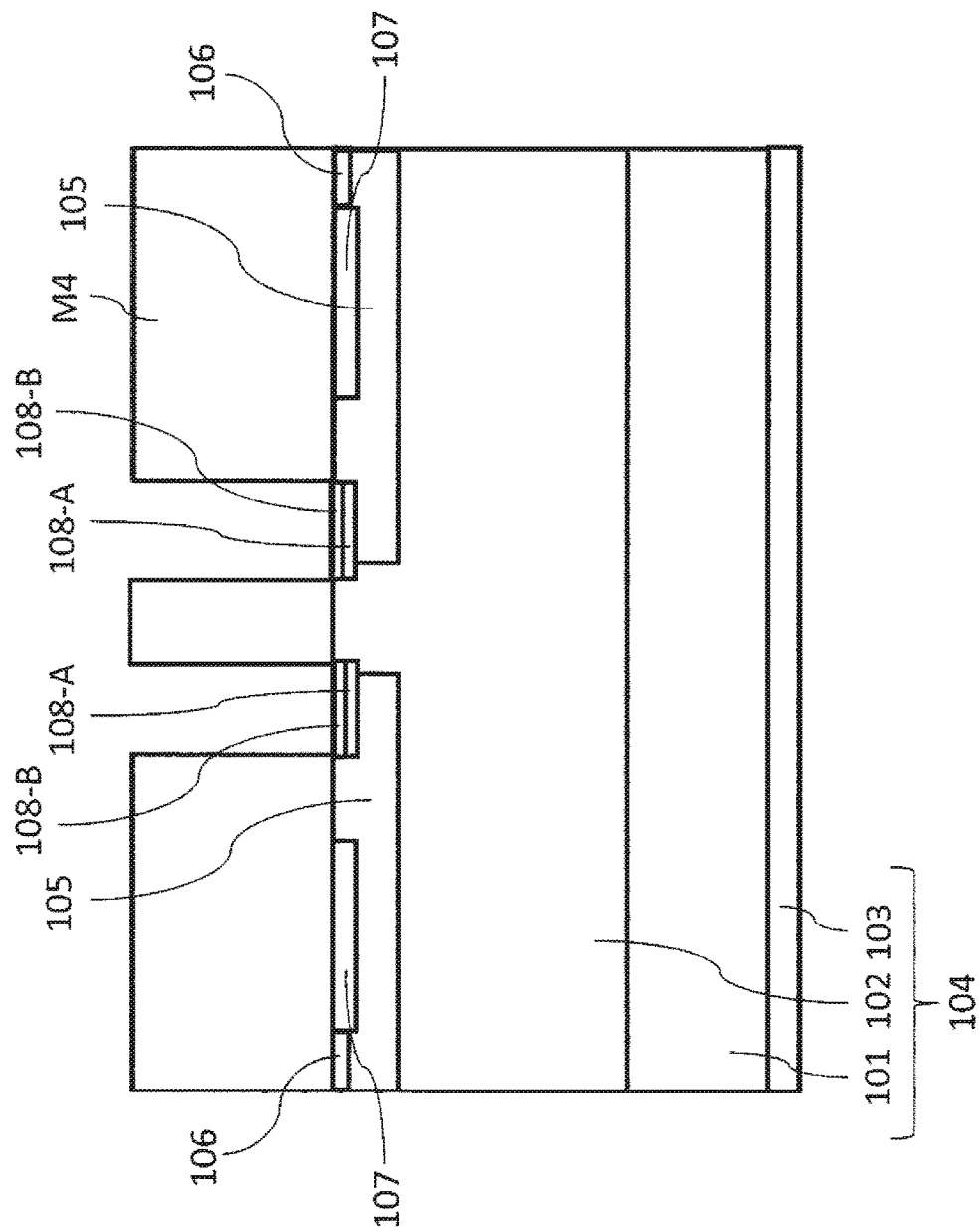

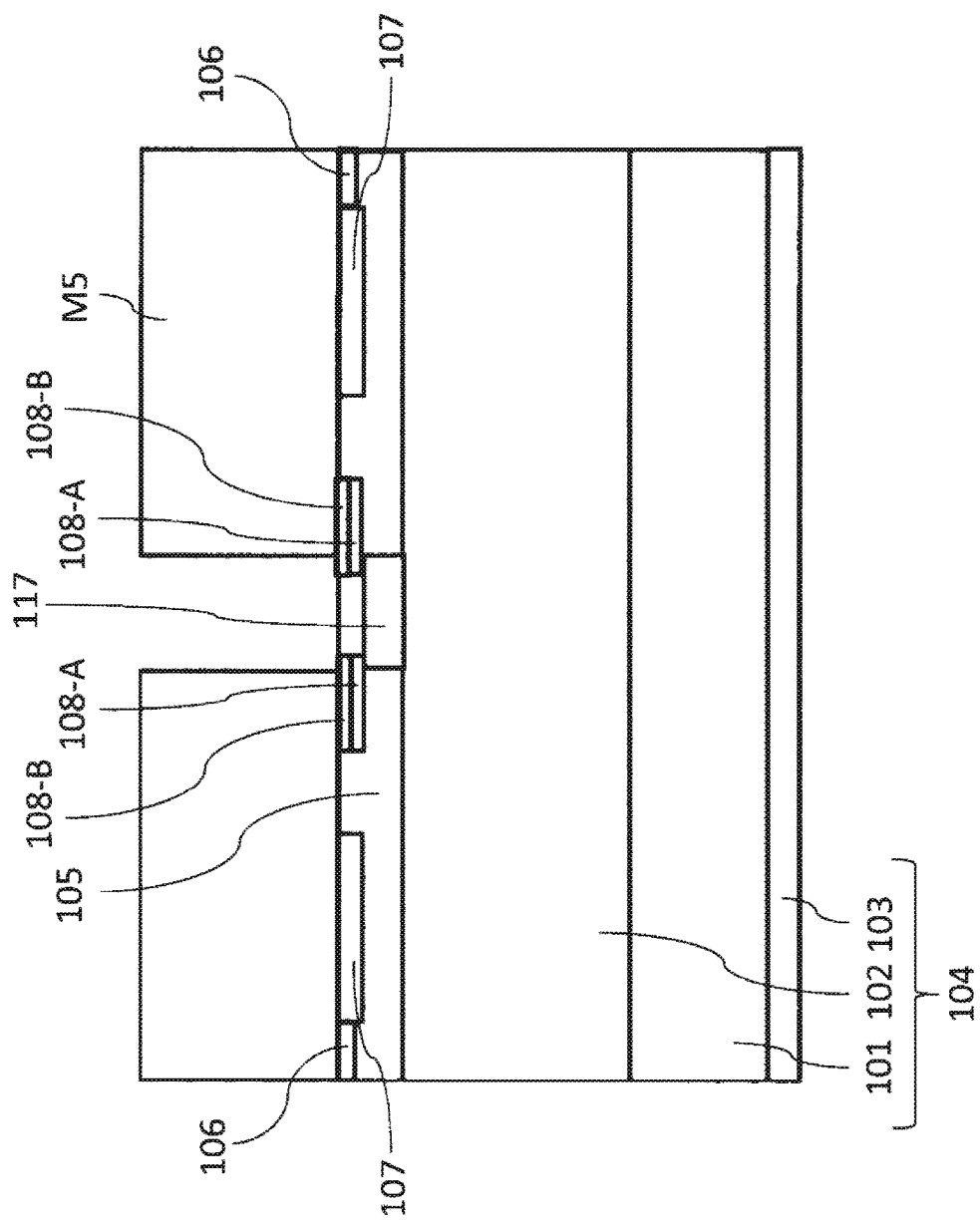

SEMICONDUCTOR DEVICE AND METHOD FOR MANUFACTURING SAME, POWER CONVERSION DEVICE, THREE-PHASE MOTOR SYSTEM, AUTOMOBILE, AND RAILWAY CARRIAGE

TECHNICAL FIELD

The present invention relates to a power semiconductor device configured by plural power semiconductor devices and its manufacturing method, a power converter, a three-phase motor system, an automobile and a railway vehicle.

BACKGROUND ART

As for a power metal insulator semiconductor field effect transistor (MISFET) which is one of power semiconductor devices, power MISFET (hereinafter called Si power MISFET) using a silicon (Si) substrate has been heretofore mainstream.

However, power MISFET (hereinafter called SiC power MISFET) using a silicon carbide (SiC) substrate (hereinafter called an SiC substrate) has higher withstand voltage, compared with the Si power MISFET and the SiC power MISFET can reduce loss more. Therefore, in a field of power saving or environmental consideration type inverter technique, the SiC power MISFET especially attracts notice.

The SiC power MISFET can lower on-resistance at the same withstand voltage, compared with the Si power MISFET. This reason is that silicon carbide (SiC) has breakdown strength equivalent to 7 times of the breakdown strength of silicon (Si) and an epitaxial layer to be a drift layer can be thinned. However, in terms of properties to be acquired from SiC, it cannot be said yet that sufficient properties are acquired and from a viewpoint of utilizing energy sufficiently efficiently, further reduction of on-resistance is desired.

One of problems to be settled as to on-resistance of SiC power MISFET having double diffused metal oxide semiconductor (DMOS) structure is channel parasitic resistance. In DMOS having low 60-V withstand voltage, channel parasitic resistance is a principal cause of parasitic resistance and in DMOS having high 3300-V withstand voltage, the channel parasitic resistance is also in the second highest place next to drift resistance. Accordingly, as for the SiC power MISFET, the reduction of the channel parasitic resistance is required.

A reason why the channel parasitic resistance is high is that mobility in a channel of an Si plane (0001) to be a channel face of DMOS is low. To settle this problem, in Patent Literature 1, a method of forming a trench by making a groove in a part of a p-type body layer and outside the body layer of DMOS and widening effective channel width is disclosed. Further, to reduce channel parasitic resistance, the utilization of a plane (11-20) and a plane (1-100) where high channel mobility is acquired is considered. To utilize a plane having high channel mobility such as the plane (11-20) and the plane (1-100), MOS having trench type structure is required to be formed on a substrate of the plane (0001). However, as in the trench type DMOS, a gate insulating film and a part of a gate are formed not only in a lower part of the p-type body layer supporting withstand voltage but immediately on a drift layer, an electric field exceeding withstand voltage is applied to the gate insulating film and breakdown is caused. Then, trial to subdue an electric field applied to a gate insulating film is made, having trench structure. Patent Literature 2 discloses a method of subduing an electric field applied to a gate insulating film by forming a part of a p-type body layer in a lower position than the gate insulating film formed in a lower part of a trench.

Further, in Patent Literature 3, structure that a p-type electric field subduing area is provided in a lower part of a trench is proposed as one of Moses having trench type structure.

CITATION LIST

Patent Literature

Patent Literature 1: WO publication No. 2010/110246
Patent Literature 2: Japanese Unexamined Patent Application Publication No. 2009-260253
Patent Literature 3: Japanese Unexamined Patent Application Publication. 2012-43955

SUMMARY OF INVENTION

Technical Problem

However, in techniques disclosed in Patent Literature 1 and Patent Literature 2, since a part of trench structure is both exposed outside each p-type body layer, an electric field applied to each gate insulating film is higher, compared with that in normal DMOS structure. Accordingly, even if initial withstand voltage is equal to or higher than desired withstand voltage, an oxide film is broken as time elapses. Further, in the technique disclosed in Patent Literature 3, since a current path is limited because of the existence of the electric field subduing area, resistance in the device is increased.

An object of the present invention is to provide a power semiconductor device for which high performance and high reliability can be expected by using trench structure for which high channel mobility can be expected and inhibiting an electric field applied to a gate insulating film in a lower part of a trench to be equal to an electric field in DMOS or less and its manufacturing method. In addition, a compact high-performance highly reliable power converter using the semiconductor device and a three-phase motor system using the power converter are provided. Further, light weight, the enhancement of performance and reliability of an automobile and a railway vehicle respectively using the three-phase motor system are provided.

Solution to Problem

According to the present invention, the abovementioned problem is settled by providing a first conductive type semiconductor substrate, a drain electrode formed on a back side of the semiconductor substrate, a drift layer of the first conductive type formed on a surface side of the semiconductor substrate, a source area of the first conductive type, a current diffused layer of the first conductive type, a body layer of a second conductive type reverse to the first conductive type in contact with the source area and the current diffused layer, a trench which pierces the source area, the body layer and the current diffused layer, which is shallower than the body layer, and the bottom of which is in contact with the body layer, a high-concentration JFET layer of the first conductive type formed up to a deeper position than a boundary between the current diffused layer and the body layer, electrically connecting the drift layer and the current diffused layer, and having higher impurity concentration than the drift layer, a gate insulating film formed on an inner wall of the trench, and a gate electrode formed on the gate insulating film.

Advantageous Effects of Invention

According to the present invention, the high-performance and highly reliable power semiconductor device can be provided. In addition, each performance of the power converter, the three-phase motor system, the automobile and the railway vehicle can be enhanced.

BRIEF DESCRIPTION OF DRAWINGS

FIG. 7 is a sectional view showing the principal part of the silicon carbide semiconductor device in the same location as the location in FIG. 4 in the manufacturing process of the silicon carbide semiconductor device continuing from FIG. 6.

FIG. 8 is a sectional view showing the principal part of the silicon carbide semiconductor device in the same location as the location in FIG. 4 in the manufacturing process of the silicon carbide semiconductor device continuing from FIG. 7.

FIG. 9 is a sectional view showing the principal part of the silicon carbide semiconductor device in the same location as the location in FIG. 4 in the manufacturing process of the silicon carbide semiconductor device continuing from FIG. 8.

FIG. 10($b$) is a sectional view showing the principal part viewed along a line AA' in FIG. 10($a$) in the manufacturing process of the silicon carbide semiconductor device continuing from FIG. 9.

FIG. 10($c$) is a sectional view showing the principal part viewed along a line BB' in FIG. 10($a$) in the manufacturing process of the silicon carbide semiconductor device continuing from FIG. 9.

FIG. 23($b$) is a sectional view showing the principal part of the silicon carbide semiconductor device viewed along a line AA' in FIG. 23($a$) in the manufacturing process continuing from FIG. 22.

FIG. 23($c$) is a sectional view showing the principal part of the silicon carbide semiconductor device viewed along a line BB' in FIG. 23($a$) in the manufacturing process continuing from FIG. 22.

DESCRIPTION OF EMBODIMENTS

Figure 1:
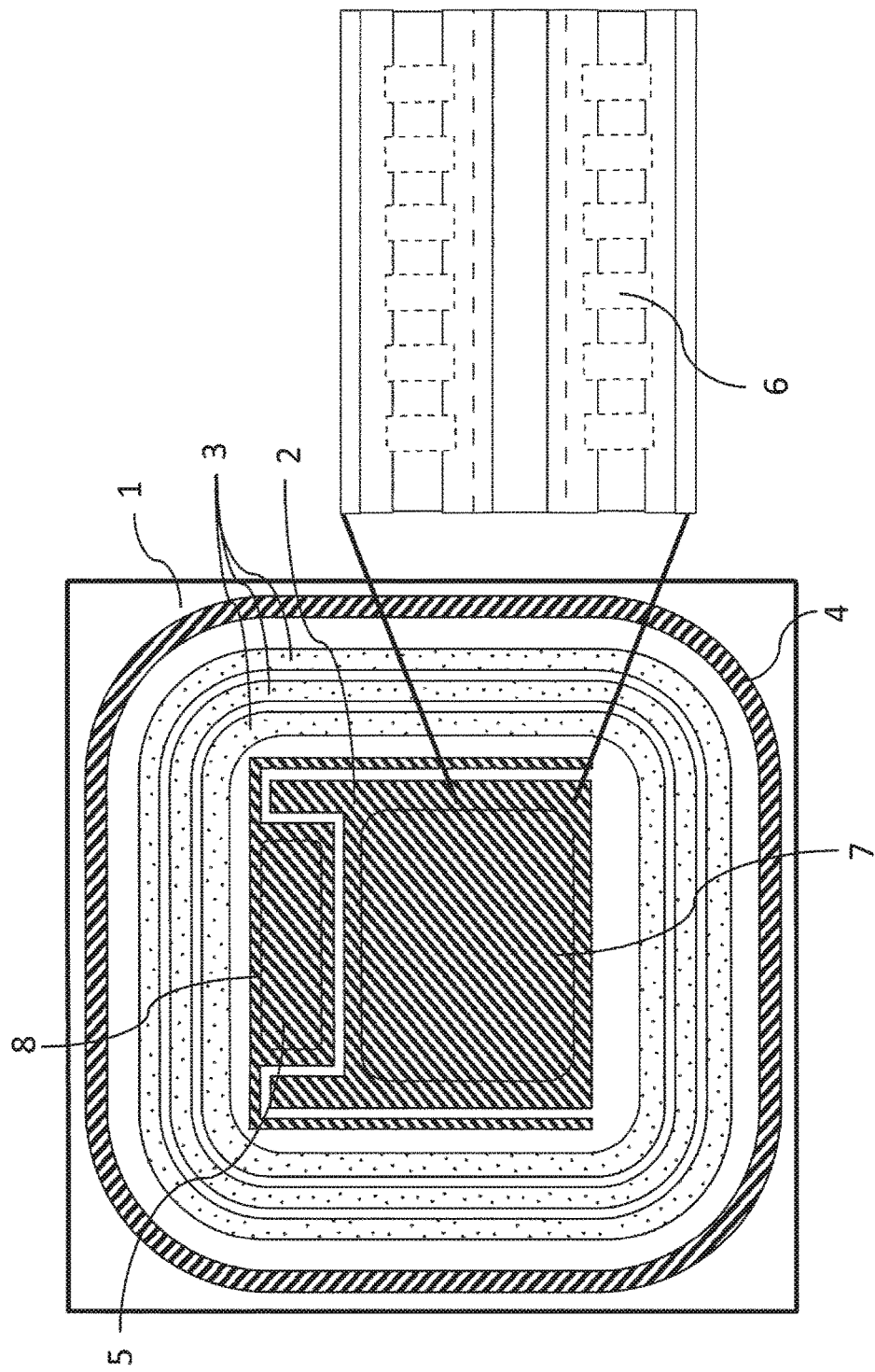
FIG. 1 is a top view showing a principal part of a semiconductor chip on which a silicon carbide semiconductor device configured by plural SiC power MISFETs is mounted in a first embodiment of the present invention.

In the following embodiments, if necessary for convenience, the present invention is divided into plural sections or plural embodiments. However, except an especially specified case, they are mutually related, and one functions as a part or the whole variations, details and supplementary explanation of the other.

Further, in the drawings referred in the following embodiments, hatching may be applied to even a plan view so as to make visibility satisfactory. Moreover, in all the drawings for explaining the following embodiments, the same reference numeral is allocated to a component having the same function in principle and its repeated explanation is omitted. Referring to the drawings, embodiments of the present invention will be described in detail below.

First Embodiment

<<Silicon Carbide Semiconductor Device>>

Figure 2:
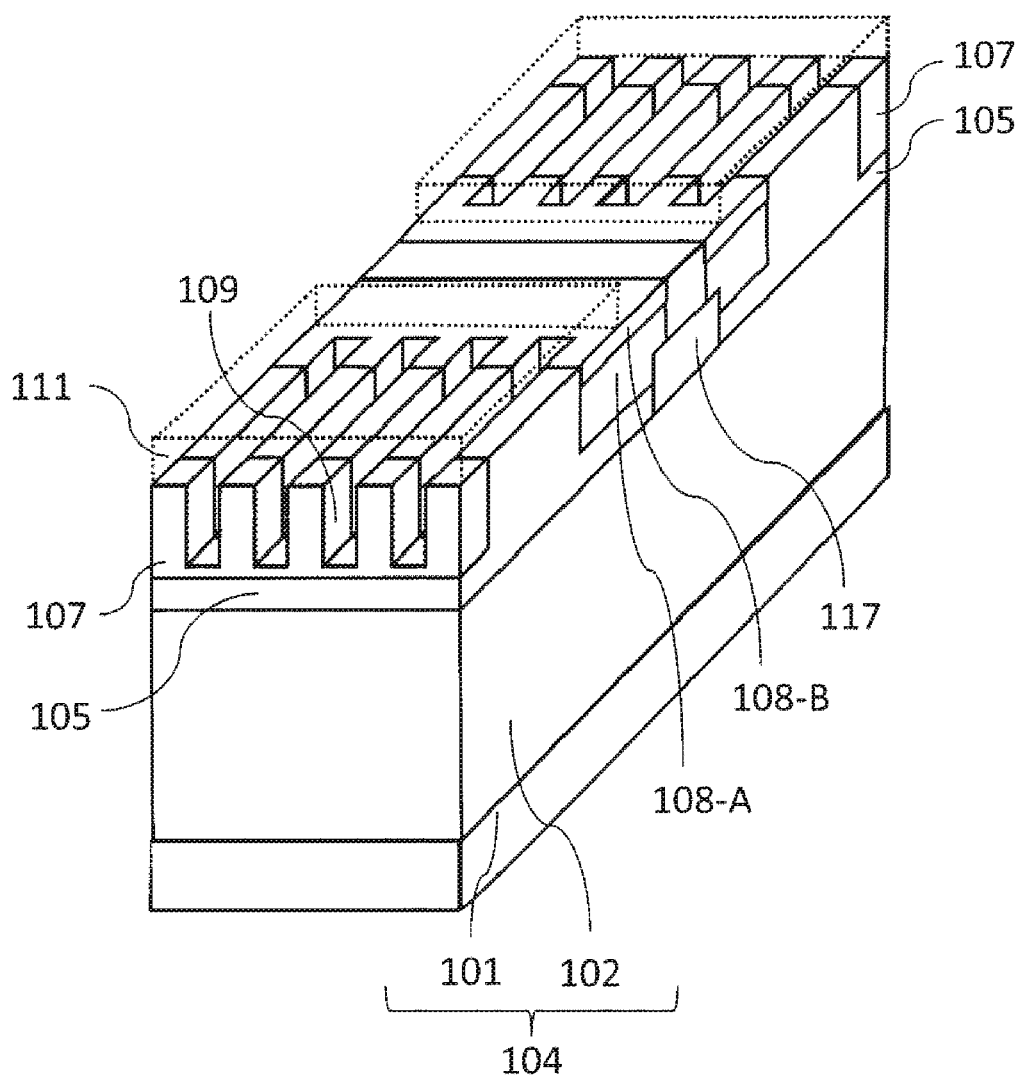
FIG. 2 is a bird's-eye view showing a principal part of the SiC power MISFET in the first embodiment of the present invention.

Referring to FIGS. 1 and 2, structure of a silicon carbide semiconductor device in a first embodiment of the present invention will be described below. FIG. 1 is a top view showing a principal part of a semiconductor chip on which a silicon carbide semiconductor device configured by plural SiC power MISFETs is mounted, and FIG. 2 is a bird's-eye view showing a principal part of the SiC power MISFET. It is the SiC power MISFET that configures the silicon carbide semiconductor device.

As shown in FIG. 1, the semiconductor chip 1 mounting the silicon carbide semiconductor device is configured by an active area (an SiC power MISFETs forming area, a device forming area) in which plural n-channel SiC power MISFETs are connected in parallel and which is located on the downside of an electrode for source wiring 2 and a circumference forming area enclosing the active area in a plan view. In the circumference forming area, plural p-type floating field limited rings (FLR) 3 enclosing the active area in a plan view and further, an n-type guard ring 4 enclosing the plural p-type floating field limiting rings 3 in a plan view are formed.

A gate electrode of the SiC power MISFET, an $n^{++}$-type source area, a channel area and others are formed on the surface side of an active area of an n-type silicon carbide (SiC) epitaxial substrate (hereinafter called an SiC epitaxial substrate), and an $n^+$-type drain area of the SiC power MISFET is formed on the back side of the SIC epitaxial substrate.

As in a power-off state, a maximum electric field part sequentially transfers to the outer p-type floating field limiting rings 3 by forming the plural p-type floating field limiting rings 3 in a circumference of the active area and the maximum electric field part breaks down by the outermost p-type floating field limiting ring 3, withstand voltage of the silicon carbide semiconductor device can be raised. FIG. 1 shows the example that the three p-type floating field limiting rings 3 are formed. However, the present invention is not limited to this example. Further, the n++-type guard ring 4 is provided with a function for protecting the SiC power MISFETs formed in the active area.

The plural SiC power MISFETs 6 formed in the active area form a stripe pattern in a plan view and all gate electrodes of the SiC power MISFETs are electrically connected to the electrode for gate wiring 8 by lead wire (a gate bus line) connected to respective stripe patterns.

Further, the plural SiC power MISFETs are covered with the electrode for source wiring 2, and sources of respective SiC power MISFETs and an electric potential fixing layer of a body layer are connected to the electrode for source wiring 2. The electrode for source wiring 2 is connected to external wiring via a source opening 7 provided to an insulating film. The electrode for gate wiring 8 is formed apart from the electrode for source wiring 2 and the electrode for gate wiring is connected to gate electrodes of respective SiC power MISFETs. The electrode for gate wiring 8 is connected to external wiring via a gate opening 5. Moreover, the $n^+$-type drain area formed on the back side of the n-type SiC epitaxial substrate is electrically connected to an electrode for drain wiring (not shown) formed on the whole back side of the n-type SiC epitaxial substrate.

Next, structure of the SiC power MISFET in the first embodiment will be described referring to FIG. 2.

An $n^-$-type epitaxial layer 102 made of silicon carbide (SiC) lower in impurity concentration than an $n^+$-type SiC substrate 101 is formed on the surface (the first principal surface) side of the $n^+$-type SiC substrate 101 made of silicon carbide (SiC), and the SiC epitaxial substrate 104 is configured by the $n^+$-type SiC substrate 101 and the $n^-$-type epitaxial layer 102. The $n^-$-type epitaxial layer 102 functions as a drift layer. The thickness of the $n^-$-type epitaxial layer 102 is approximately 5 to 50 μm, for example.

A p-type body layer (a well area) 105 having a predetermined depth from a surface of the epitaxial layer 102 is formed in the epitaxial layer 102.

Though the following is not shown in FIG. 2, a p$^{++}$-type body layer electric potential fixing area 106 is formed.

Further, the n$^{++}$-type source area 107 having a predetermined depth from the surface of the epitaxial layer 102 and including nitrogen as impurities is formed in the p-type body layer 105.

An n-type current diffused layer 108-A having a predetermined depth from the surface of the epitaxial layer 102 is formed in the epitaxial layer 102 between the p-type body layers 105. In addition, a p$^+$-type gate insulating film protective layer 108-B having a predetermined depth from the surface of the epitaxial layer 102 is formed in the epitaxial layer 102 between the p-type body layers 105.

An n-type high-concentration JFET layer 117 having height from a predetermined depth to a predetermined depth from the surface of the epitaxial layer 102 and having higher impurity concentration than impurity concentration of the n$^-$-type epitaxial layer 102 is formed in the epitaxial layer 102 between the p-type body layers 105.

A trench extended from the n$^{++}$-type source area 107 to the n-type current diffused layer 108-A and the p-type gate insulating film protective layer 108-B through the p-type body layer 105 is formed. A bottom of the trench 109 is in contact with the p-type body layer 105. A gate insulating film 110 (not shown in FIG. 2) is formed on a surface of the trench 109, a surface of the p-type body layer 105, the p-type gate insulating film protective layer 108-B, and the surface of the epitaxial layer 102 between p-type body layers 105. A gate electrode 111 is formed on the gate insulating film 110 except the gate insulating film on the epitaxial layer 102 between the p-type body layers 105.

The depth (first depth) from the surface of the epitaxial layer 102 of the p-type body layer 105 is approximately 0.5 to 2.0 μm, for example. Further, the depth (third depth) from the surface of the epitaxial layer 102 of the n$^{++}$-type source area 107 is approximately 0.1 to 0.6 μm, for example. In the meantime, the depth (fourth depth) from the surface of the epitaxial layer 102 of the n-type current diffused layer area 108-A is approximately 0.1 to 0.7 μm, for example. The depth (fifth depth) from the surface of the epitaxial layer 102 of the p$^+$-type gate insulating film protective layer 108-B is approximately 0.05 to 0.3 μm, for example. The depth (sixth depth) from the surface of the epitaxial layer 102 of a top face of the n-type high-concentration JFET layer 117 is shallower than the depth (fourth depth) from the surface of the epitaxial layer 102 of the n-type current diffused layer area 108-A and for example, the depth is approximately 0.1 to 0.7 μm. The depth (seventh depth) from the surface of the epitaxial layer 102 of a bottom of the n-type high-concentration JFET layer 117 is deeper than the depth (fourth depth) from the surface of the epitaxial layer 102 of the n-type current diffused layer area 108-A, that is, the depth is deeper than a boundary between the n-type current diffused layer area 108-A and the p-type body layer 105, and for example, the depth is approximately 0.5 to 2.0 μm. The depth (eighth depth) from the surface of the epitaxial layer 102 of the trench 109 is shallower than the depth (first depth) from the surface of the epitaxial layer 102 of the p-type body layer 105 and for example, the depth is approximately 0.1 to 1.5 μm. The length in a direction parallel to channel length of the trench is approximately 1 to 3 μm, for example. Length in a direction parallel to channel width of the trench is approximately 0.1 to 2 μm, for example. An interval between trenches in the direction parallel to the channel width is approximately 0.1 to 2 μm, for example.

Though the following is not shown in FIG. 2, the depth (second depth) from the surface of the epitaxial layer 102 of the p$^{++}$-type body layer electric potential fixing area 106 is approximately 0.1 to 0.3 μm, for example.

Further, "−" and "+" are signs representing n-type or p-type relative concentration of impurities as a conductive type and for example, the concentration of n-type impurities is higher in the order of "n$^-$", "n", "n$^+$" and "n$^{--}$".

A desirable range of impurity concentration of the n$^+$-type SiC substrate 101 is $1\times10^{18}$ to $1\times10^{21}$ cm$^{-3}$, for example. A desirable range of impurity concentration of the n$^-$-type epitaxial layer 102 is $1\times10^{14}$ to $1\times10^{17}$ cm$^{-3}$, for example. A desirable range of impurity concentration of the p-type body layer 105 is $1\times10^{16}$ to $1\times10^{19}$ cm$^{-3}$, for example. In addition, a desirable range of impurity concentration of the n$^{++}$-type source area 107 is $1\times10^{19}$ to $1\times10^{21}$ cm$^{-3}$, for example. A desirable range of impurity concentration of the n-type current diffused area 108-A is $5\times10^{16}$ to $5\times10^{18}$ cm$^{-3}$, for example. A desirable range of impurity concentration of the p$^+$-type gate insulating film protective layer 108-B is $5\times10^{16}$ to $5\times10^{18}$ cm$^{-3}$, for example. A desirable range of impurity concentration of the n-type high-concentration JFET area 117 is $1\times10^{16}$ to $1\times10^{17}$ cm$^{-3}$, for example. Though the following is not shown in FIG. 2, a desirable range of impurity concentration of the p$^{++}$-type body layer electric potential fixing area 106 is $1\times10^{19}$ to $1\times10^{21}$ cm$^{-3}$, for example. Since the impurity concentration of the n-type current diffused area 108-A readily contributes to resistance because the n-type current diffused area 108-A is directly connected to a channel, the impurity concentration is set to be higher than the impurity concentration of the n-type high-concentration JFET area 117.

A channel area is the surface of the trench 109 and the surface of the p-type body layer 105 between the trenches 109.

The gate insulating film 110 is formed on the channel area and the gate electrode 111 is formed on the gate insulating film 110. An end of the gate electrode 111 on the JFET area side is located on the upside of the p$^+$-type gate insulating film protective layer 108-B extended on the upside of the n-type high-concentration JFET area 117 in a longitudinal direction of the trench 109 from the body layer 105, that is, in a channel direction of the trench 109.

Next, a characteristic of a configuration of the SiC power MISFET in the first embodiment will be described referring to FIG. 2.

As shown in FIG. 2, since the side of the trench 109 functions as a channel area, higher channel mobility can be expected, compared with the channel area on the surface of the SiC epitaxial substrate 104. Further, channel width is increased by forming the trench 109, compared with normal DMOS structure having no trench, lower channel resistance can be expected. Further, since the trench is formed up to a deeper position than a boundary between the current diffused layer 108-A and the body layer 105 and the trench is provided with the n-type high-concentration JFET area 117 electrically connecting the drift layer with the current diffused layer 108-A and having higher impurity concentration than the drift layer, low JFET resistance can be expected. The trench is formed in only the p-type body layer 105, and therefore an electric field applied to the gate insulating film formed on the surface of the trench can be greatly subdued in holding withstand voltage, compared with normal trench-type MOS structure having a portion exposed from the p-type body layer. In addition, in this embodiment, the p$^+$-type gate insulating film protective layer 108-B is provided between the n-type high-concentration JFET area 117 and the gate insulating film 110 in an area held between adjacent channel areas. Hereby, an oxide film electric field on the upside of the n-type high-concentration JFET area 117 can be greatly subdued. Further, in this embodiment, the end of the gate electrode 111 is formed on the upside of the p$^+$-type gate insulating film protective layer 108-B. Accordingly, the oxide film electric field on the JFET area applied in holding withstand voltage can be further subdued, compared with the normal DMOS structure.

Low channel resistance similar to that of the normal trench-type MOS structure is realized by providing high channel mobility and wide channel width as described above and further, low JFET resistance can also be realized. Therefore, high current density can be realized. Furthermore, as high insulating film reliability can be acquired, more reliable SiC power MOSFET can be provided than the normal DMOS structure. Furthermore, as no gate electrode 111 is formed over the JFET area, the area having capacitance with the n$^-$-type epitaxial layer 102 is small. Accordingly, Miller effect caused in switching is reduced and switching loss can be reduced. Therefore, lower conduction loss and lower switching loss than those of the normal DMOS structure can be provided.

<<Manufacturing Method of Silicon Carbide Semiconductor Device>>

Figure 3:
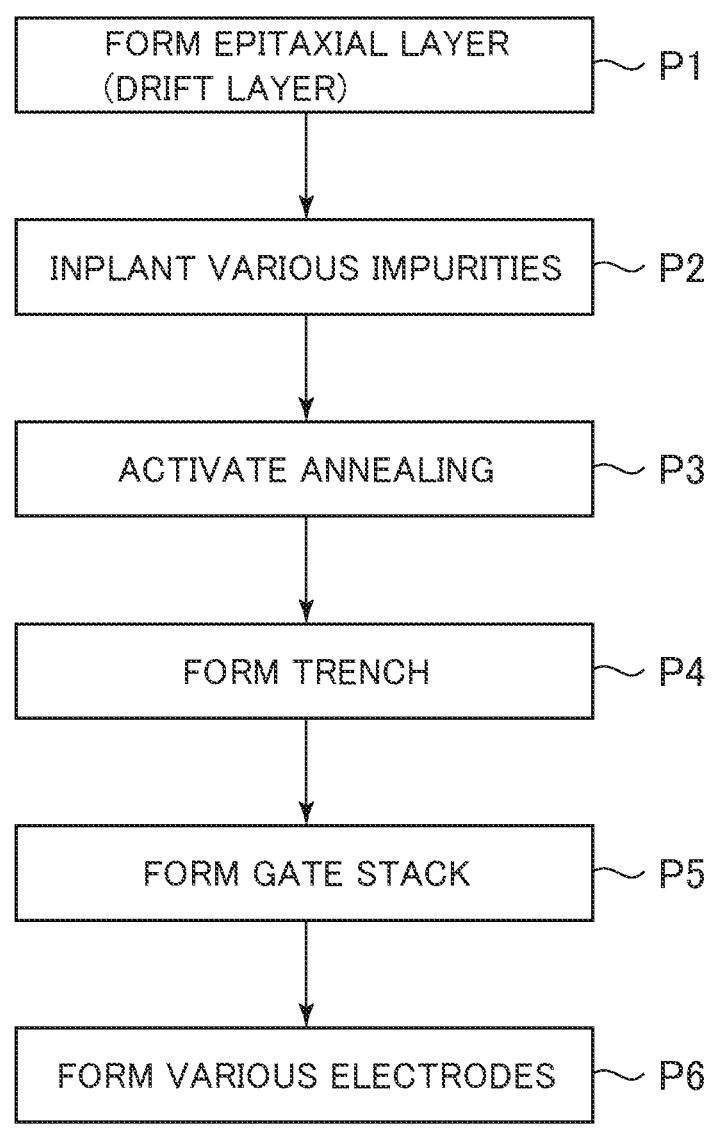
FIG. 3 is a flowchart for explaining a manufacturing method of the semiconductor device in the first embodiment.
Figure 10A:
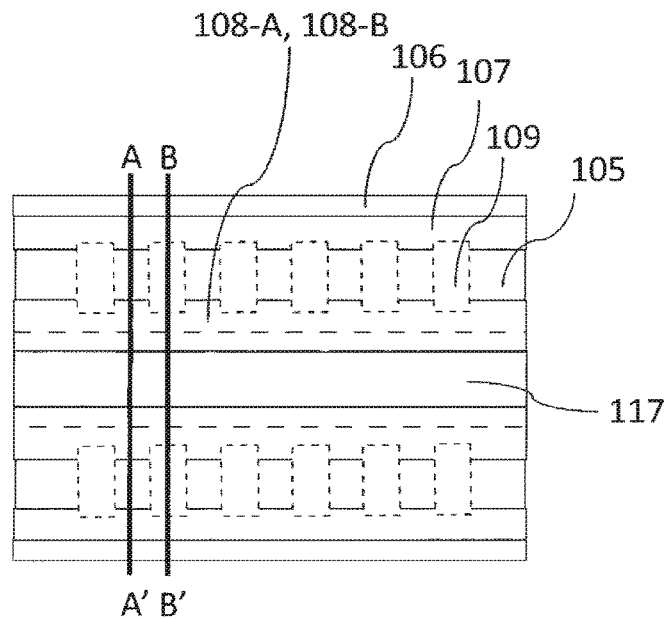
FIG. 10($a$) is a top view showing the principal part in the manufacturing process of the silicon carbide semiconductor device continuing from FIG. 9.

A manufacturing method of the silicon carbide semiconductor device in the first embodiment of the present invention will be described referring to FIGS. 3 to 18 below. FIG. 3 is a process drawing for explaining the manufacturing method of the semiconductor device in the first embodiment. FIGS. 4 to 9 and FIGS. 10(b) to 18 are sectional views showing the principal part acquired by enlarging a part of the SiC power MISFET forming area (the device forming area) of the silicon carbide semiconductor device. FIG. 10(a) is a top view showing the principal part of the semiconductor chip mounting the silicon carbide semiconductor device including the SiC power MISFET.

<Process P1>

Figure 4:
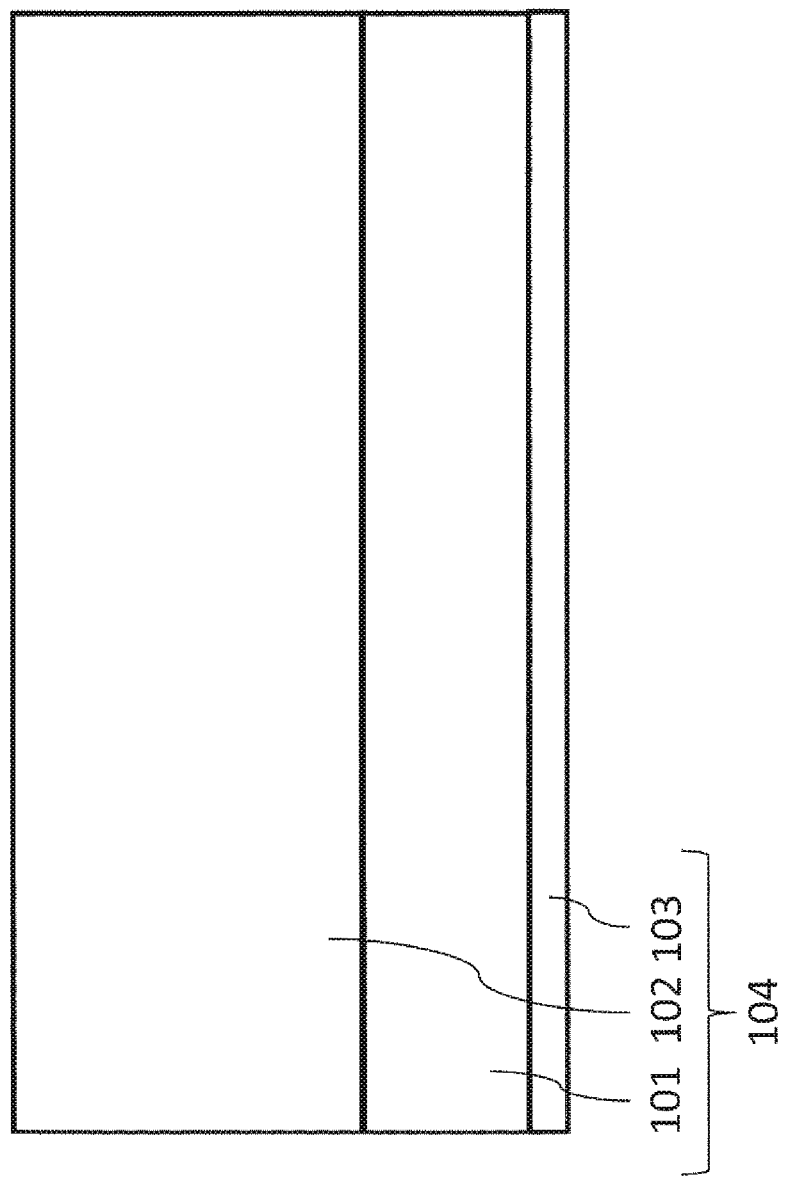
FIG. 4 is a sectional view showing the principal part of the silicon carbide semiconductor device illustrating a manufacturing process of the silicon carbide semiconductor device in the first embodiment of the present invention.

First, as shown in FIG. 4, the n$^+$-type 4H-Sic substrate 101 is prepared. n-type impurities are doped into the n$^+$-type SiC substrate 101. The n-type impurities are nitrogen (N) for example and the concentration of the n-type impurities is in a range of $1\times10^{18}$ to $1\times10^{21}$ cm$^{-3}$, for example. Further, the n$^+$-type SiC substrate 101 has double sides of the Si side and the C side. However, a surface of the n$^+$-type SiC substrate 101 may be located on the Si side or the C side.

Next, the n$^-$-type epitaxial layer 102 made of silicon carbide (SiC) is formed on the surface (the first principal surface) of the n+-type SiC substrate 101 according to an epitaxial growth process. n-type impurities lower than the impurity concentration of the n$^+$-type SiC substrate 101 are doped into the n$^-$-type epitaxial layer 102. The impurity concentration of the n$^-$-type epitaxial layer 102 depends upon a rating of the SiC power MISFET. However, the impurity concentration is in a range of $1\times10^{14}$ to $1\times10^{17}$ cm$^{-3}$, for example. Further, the thickness of the n$^-$-type epitaxial layer 102 is 5 to 50 µm, for example. The SiC epitaxial substrate 104 configured by the n$^+$-type SiC substrate 101 and the n$^-$-type epitaxial layer 102 is formed by the abovementioned process.

<Process P2>

Next, the n$^+$-type drain area 103 having a predetermined depth (seventh depth) from the back side (a second principal surface) of the n$^+$-type SiC substrate 101 is formed on the back side of the n$^+$-type SiC substrate 101. Impurity concentration of the n$^+$-type drain area 103 is in a range of $1\times10^{19}$ to $1\times10^{21}$ cm$^{-3}$, for example.

Figure 5:
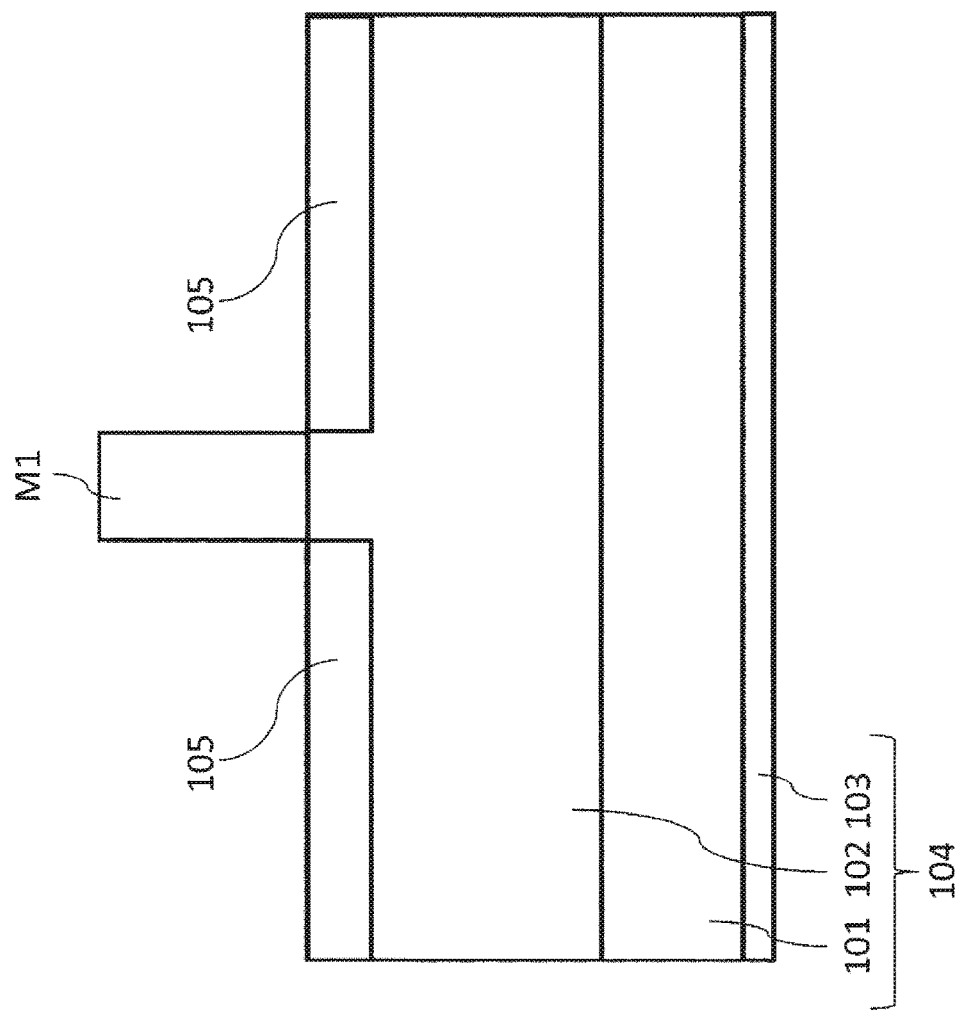
FIG. 5 is a sectional view showing the principal part of the silicon carbide semiconductor device in the same location as a location in FIG. 4 in the manufacturing process of the silicon carbide semiconductor device continuing from FIG. 4.

Next, as shown in FIG. 5, a mask M1 is formed on the surface of the n$^-$-type epitaxial layer 102. The thickness of the mask M1 is approximately 1.0 to 3.0 µm, for example. The width of the mask M1 in a device forming area is approximately 1.0 to 5.0 µm, for example. For materials of the mask, an SiO$_2$ film, an Si film and an SiN film respectively as inorganic material, a resist film and a polyimide film respectively as organic material can be used.

Next, p-type impurities, for example, aluminum atoms (Al) are ion-implanted in the n-type epitaxial layer 102 from the upside of the mask M1. Hereby, the p-type body layers 105 are formed in the device forming area of the n$^-$-type epitaxial layer 102. Though the following is not shown in FIG. 5, the p-type floating field limiting rings 3 are simultaneously formed in the circumference of the device forming area. For structure of a termination, the present invention is not limited to this and the termination structure may also be junction termination extension (JTE) structure, for example.

The depth (first depth) from the surface of the epitaxial layer 102 of the p-type body layer 105 is approximately 0.5 to 2.0 µm, for example. Further, the impurity concentration of the p-type body layer 105 is in a range of $1\times10^{16}$ to $1\times10^{19}$ cm$^{-3}$, for example.

Figure 6:
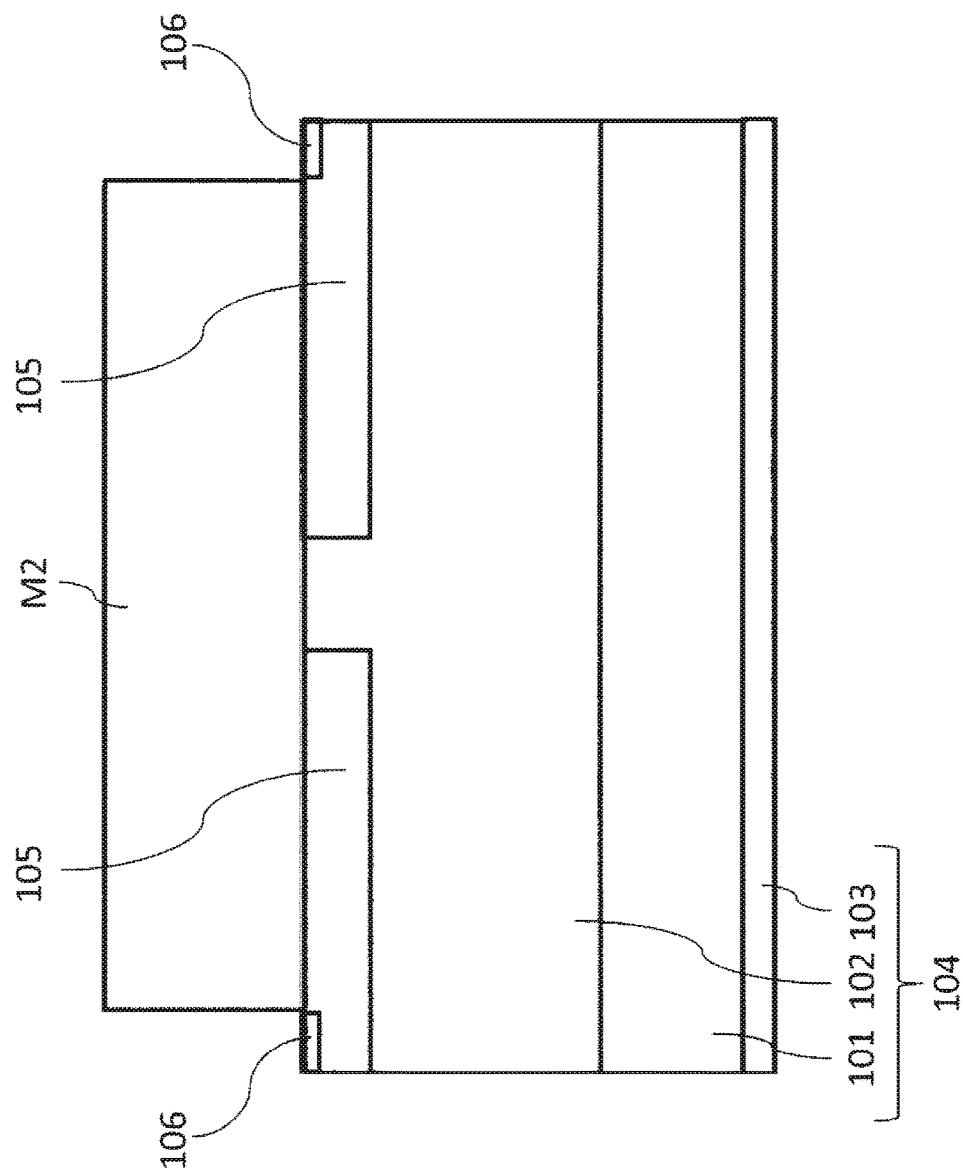
FIG. 6 is a sectional view showing the principal part of the silicon carbide semiconductor device in the same location as the location in FIG. 4 in the manufacturing process of the silicon carbide semiconductor device continuing from FIG. 5.

Next, as shown in FIG. 6, after the mask M1 is removed, a mask M2 is formed by a resist film, for example. The thickness of the mask M2 is approximately 0.5 to 3 µm, for example. An opening is provided to only an area for forming the p$^{++}$-type body layer electric potential fixing area 106 for fixing electric potential of the p-type body layer 105 in a posterior process of the mask M2.

Next, p-type impurities, for example, aluminum atoms (Al) are ion-implanted in the n$^-$-type epitaxial layer 102 from the upside of the mask M2 and the p$^{++}$-type body layer electric potential fixing area 106 is formed. The depth (second depth) from the surface of the epitaxial layer 102 of the p$^{++}$-type body layer electric potential fixing area 106 is approximately 0.1 to 0.3 µm, for example. Impurity concentration of the p$^{++}$-type body layer electric potential fixing area 106 is in a range of $1\times10^{19}$ to $1\times10^{21}$ cm$^{-3}$, for example.

Next, as shown in FIG. 7, after the mask M2 is removed, a mask M3 is formed by a resist film. Thickness of the mask M3 is approximately 0.5 to 3 µm, for example. An opening is provided to an area for forming the n$^{++}$-type source area 107 in the posterior process of the mask M3. Further, though the following is not shown in FIG. 7, an opening is also provided to an area for forming the guard ring 4 outside the floating field limiting rings 3 of the mask M3.

Next, nitrogen atoms (N) are ion-implanted in the epitaxial layer 102 as n-type impurities from the upside of the mask M3, the n$^{++}$-type source area 107 is formed in the device forming area, and though the following is not shown in FIG. 7, the n$^{++}$-type guard ring 4 is formed in the circumference forming area. The depth (third depth) from the surface of the epitaxial layer 102 of the n$^{++}$-type source area 107 and the n$^{++}$-type guard ring 4 is approximately 0.1 to 0.6 µm, for example. Further, the impurity concentration of n$^{++}$-type source area 107 and the n$^{++}$-type guard ring 4 is in a range of $1\times10^{19}$ to $1\times10^{21}$ cm$^{-3}$, for example.

Next, as shown in FIG. 8, after the mask M3 is removed, a mask 4 is formed by a resist film, for example. The thickness of the mask M4 is approximately 0.5 to 3 µm, for example. An opening is provided to an area for forming the n$^+$-type current diffused area 108-A in the posterior process of the mask M4.

Next, nitrogen atoms (N) are ion-implanted in the epitaxial layer 102 as n-type impurities from the upside of the mask M4 and the n$^+$-type current diffused area 108-A is formed in the device forming area partially including the area 105 formed using the mask M3. The depth (fourth depth) from the surface of the epitaxial layer 102 of the n$^+$-type current diffused area 108-A is approximately 0.1 to 0.7 μm, for example. Further, the impurity concentration of the n$^+$-type current diffused area 108-A is in a range of $5\times10^{16}$ to $5\times10^{18}$ cm$^{-3}$, for example.

Next, aluminum atoms (Al) are ion-implanted in the epitaxial layer 102 as p-type impurities from the upside of the mask M4 and the p$^+$-type gate insulating film protective area 108-B is formed in the device forming area. The depth (fifth depth) from the surface of the epitaxial layer 102 of the p$^+$-type gate insulating film protective area 108-B is approximately 0.05 to 0.3 μm, for example. Further, the impurity concentration of the p$^+$-type gate insulating film protective area 108-B is in a range of $5\times10^{16}$ to $5\times10^{18}$ cm$^{-3}$, for example.

Next, as shown in FIG. 9, after the mask M4 is removed, a mask 5 is formed by a resist film, for example. The thickness of the mask M5 is approximately 0.5 to 3 μm, for example. An opening is provided to an area for forming the n-type high-concentration JFET area 117 in the posterior process of the mask M5. Further, the opening of the mask 5 is overlapped with the opening of the mask M4.

Next, nitrogen atoms (N) are ion-implanted in the epitaxial layer 102 as n-type impurities from the upside of the mask 5 and the n-type high-concentration JFET area 117 is formed in the device forming area. The depth (sixth depth) of the top face of the n-type high-concentration JFET area 117 is shallower than the fourth depth and the depth is approximately 0.1 to 0.7 μm, for example. The depth (seventh depth) of the bottom of the n-type high-concentration JFET area 117 is similar to the depth (first depth) of the p-type body layer 105 and the depth is approximately 0.5 to 2.0 μm, for example. Hereby, the n-type high-concentration JFET area 117 is formed up to a deeper area than the n$^+$-type current diffused area 108-A. Further, since the opening of the mask M5 is overlapped with the opening of the mask M4 is overlapped, the n-type high-concentration JFET area 117 is in contact with the n$^+$-type current diffused area 108-A and the JFET area is electrically connected to the current diffused area. The impurity concentration of the n-type high-concentration JFET area 117 is in a range of $1\times10^{16}$ to $1\times10^{17}$ cm$^{-3}$, for example.
<Process P3>

Next, after the mask M5 is removed, a carbon (C) film is deposited on the surface side and on the back side of the SiC epitaxial substrate 104 by a plasma-activated CVD method for example though the above description is not shown. Thickness of the carbon (C) film is approximately 0.03 μm, for example. After the surface and the back side of the SiC epitaxial substrate 104 are covered with the carbon (C) film, heat treatment at 1500° C. or more is applied to the SiC epitaxial substrate 104 for approximately 2 to 3 minutes. Hereby, each impurity ion-implanted in the SiC epitaxial substrate 104 is activated. After the heat treatment, the carbon (C) film is removed by oxygen plasma treatment, for example.
<Process P4>

Figure 10B:
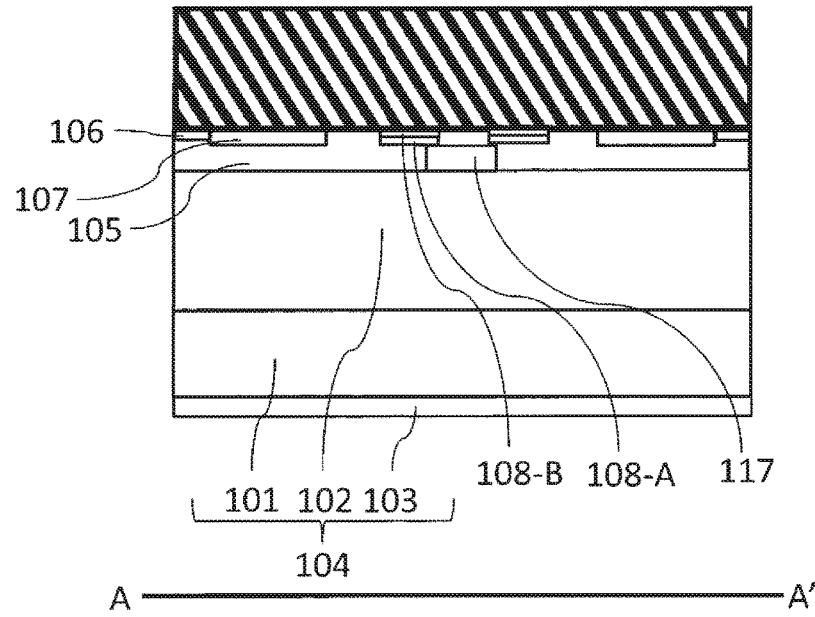
Figure 10:
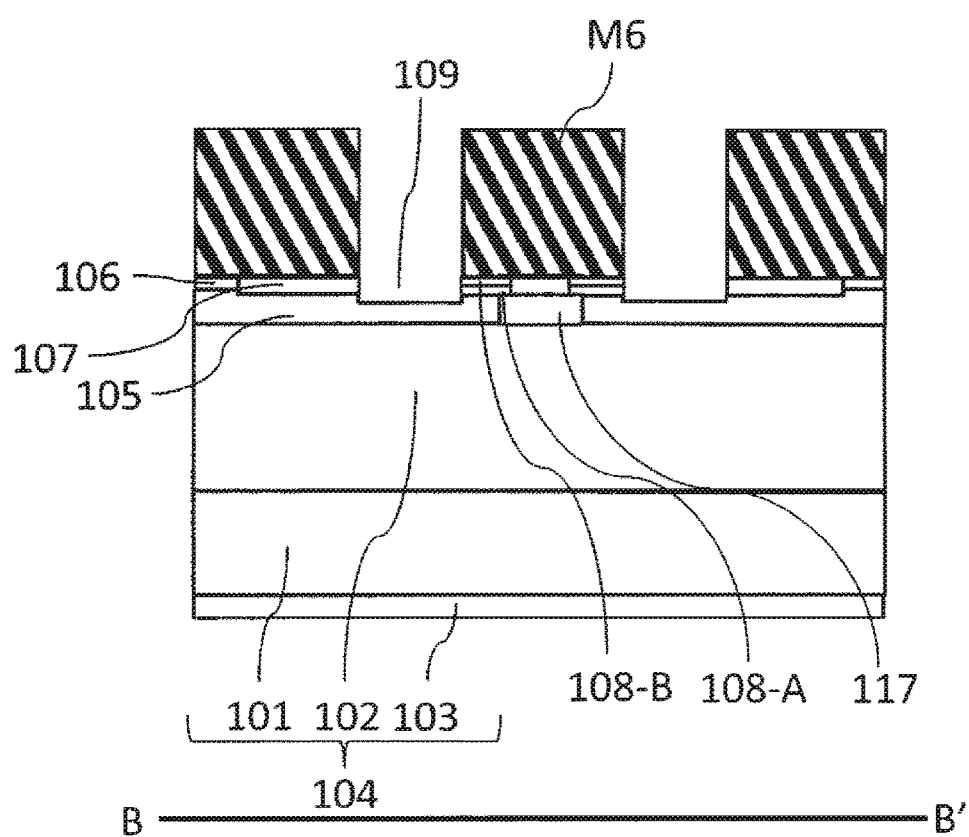

Next, as shown in FIGS. 10(a) to (c), a mask M6 is formed by a resist film, for example. FIG. 10(a) is a top view showing the principal part, FIG. 10(b) is a sectional view viewed along a line AA' in FIG. 10(a), and FIG. 10(c) is a sectional view showing the principal part viewed along a line BB' in FIG. 10(a). The thickness of the mask M6 is approximately 0.5 to 3 μm, for example. An opening is provided to an area for the trench 109 to be formed in the posterior process of the mask M6.

Next, the trench 109 piercing the n$^{++}$-type source area 107, the p-type body layer 105, the n$^+$-type current diffused area 108-A and the p$^+$-type gate insulating film protective area 108-B is formed using a dry etching process. The depth of the formed trench is shallower than the depth of the p-type body layer 105 and is deeper than the depth of the p$^+$-type gate insulating film protective area 108-B. The depth of the formed trench is approximately 0.1 to 1.5 μm, for example. The trench length parallel to the channel length of the trench is approximately 1 to 3 μm, for example. An interval between the trenches in a direction parallel to channel width is approximately 0.1 to 1 μm, for example.
<Process P5>

Figure 11:
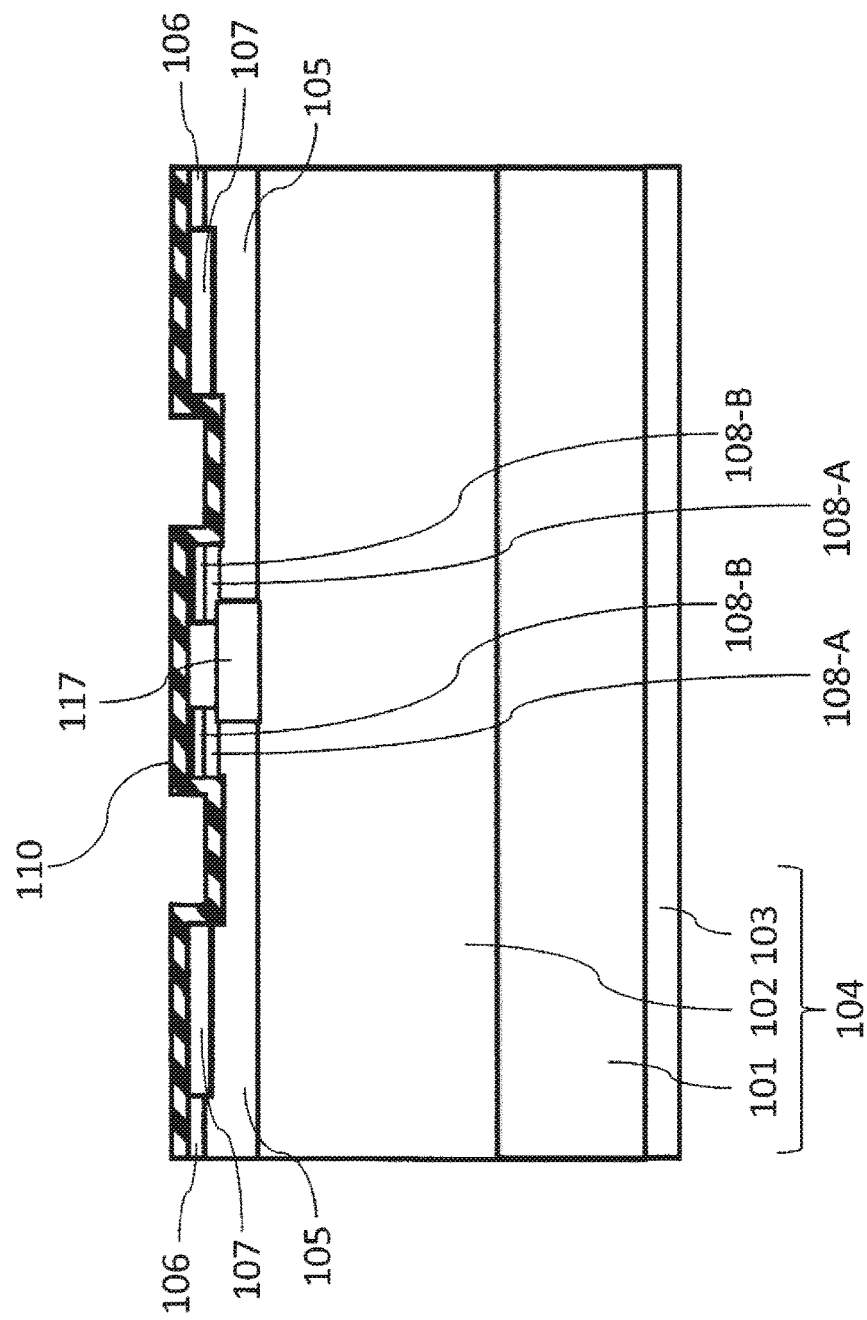
FIG. 11 is a sectional view showing the principal part of the silicon carbide semiconductor device in the same location as the location in FIG. 4 in the manufacturing process of the silicon carbide semiconductor device continuing from the FIGS. 10($a$) to ($c$).

Next, as shown in FIG. 11, after the mask M6 is removed, the gate insulating film 110 is formed on the surface of the epitaxial layer 102 and the surface of the trench 109. The gate insulating film 110 is an SiO$_2$ film formed by a thermal CVD method, for example. Thickness of the gate insulating film 110 is approximately 0.005 to 0.15 μm, for example.

Figure 12:
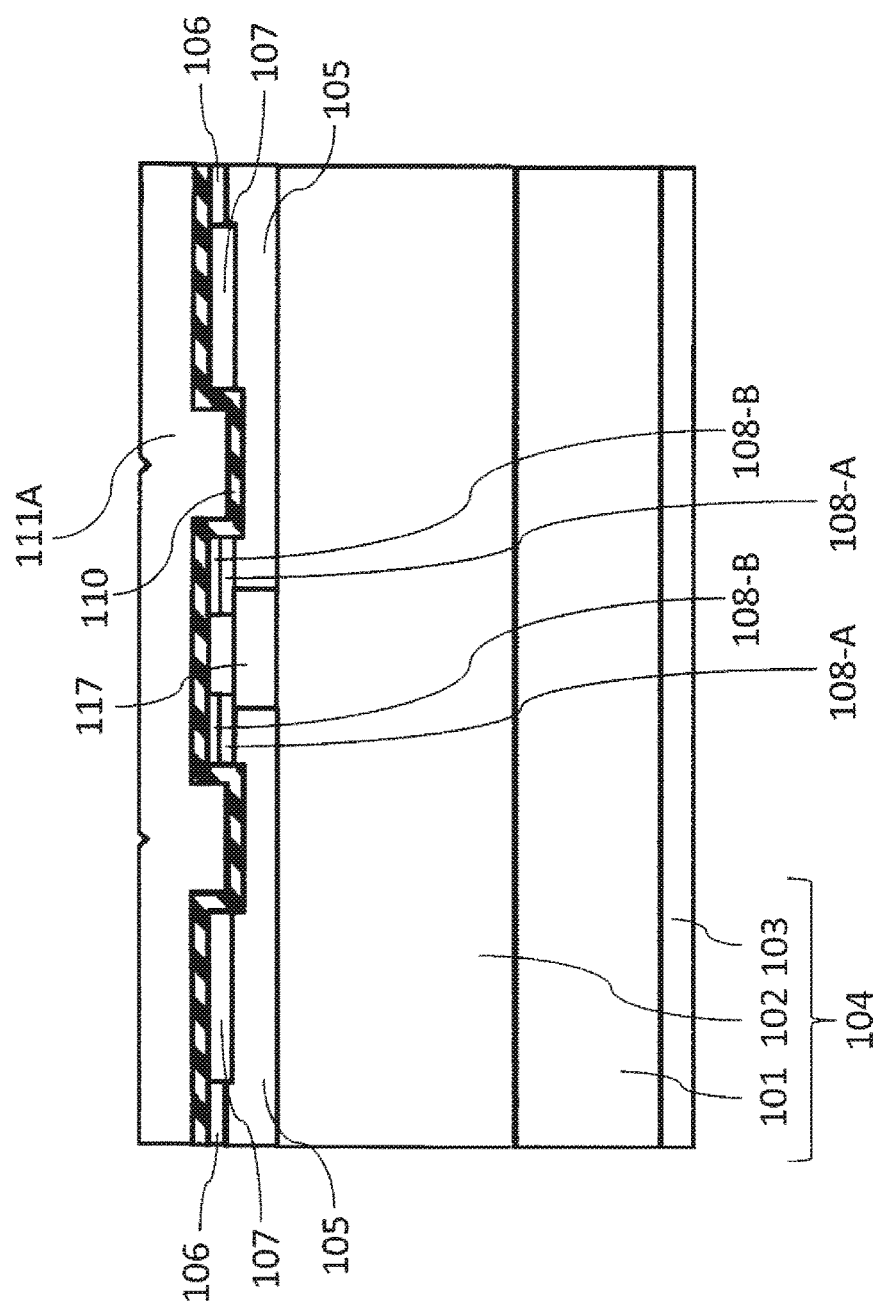
FIG. 12 is a sectional view showing the principal part of the silicon carbide semiconductor device in the same location as the location in FIG. 4 in the manufacturing process of the silicon carbide semiconductor device continuing from the FIG. 11.

Next, as shown in FIG. 12, an n-type polycrystalline silicon (Si) film 111A is formed on the gate insulating film 110. The thickness of the n-type polycrystalline silicon (Si) film 111A is approximately 0.01 to 4 μm, for example.

Figure 13:
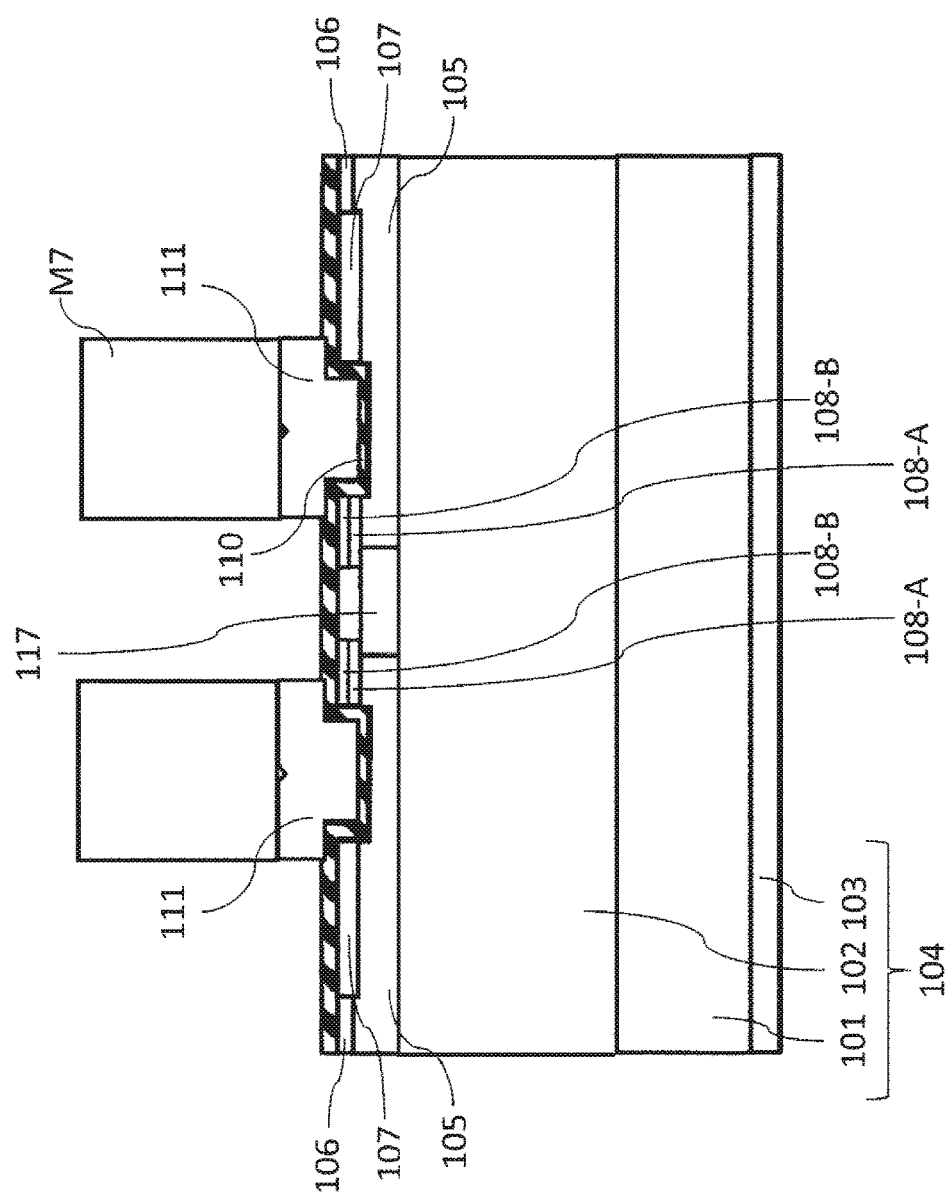
FIG. 13 is a sectional view showing the principal part of the silicon carbide semiconductor device in the same location as the location in FIG. 4 in the manufacturing process of the silicon carbide semiconductor device continuing from the FIG. 12.

Next, as shown in FIG. 13, the polycrystalline silicon (Si) film 111A is etched by dry etching using a mask M7 (a photoresist film) and the gate electrode 111 is formed. At this time, the polycrystalline silicon (Si) film 111A on the JFET area between the p-type body layers 105 is removed.

Next, after the mask M7 is removed, the gate electrode 111 is lightly oxidized though the above description is not shown. For example, for a condition, the gate electrode is oxidized at 900° C. for 30 minutes by dry oxidation.
<Process P6>

Figure 14:
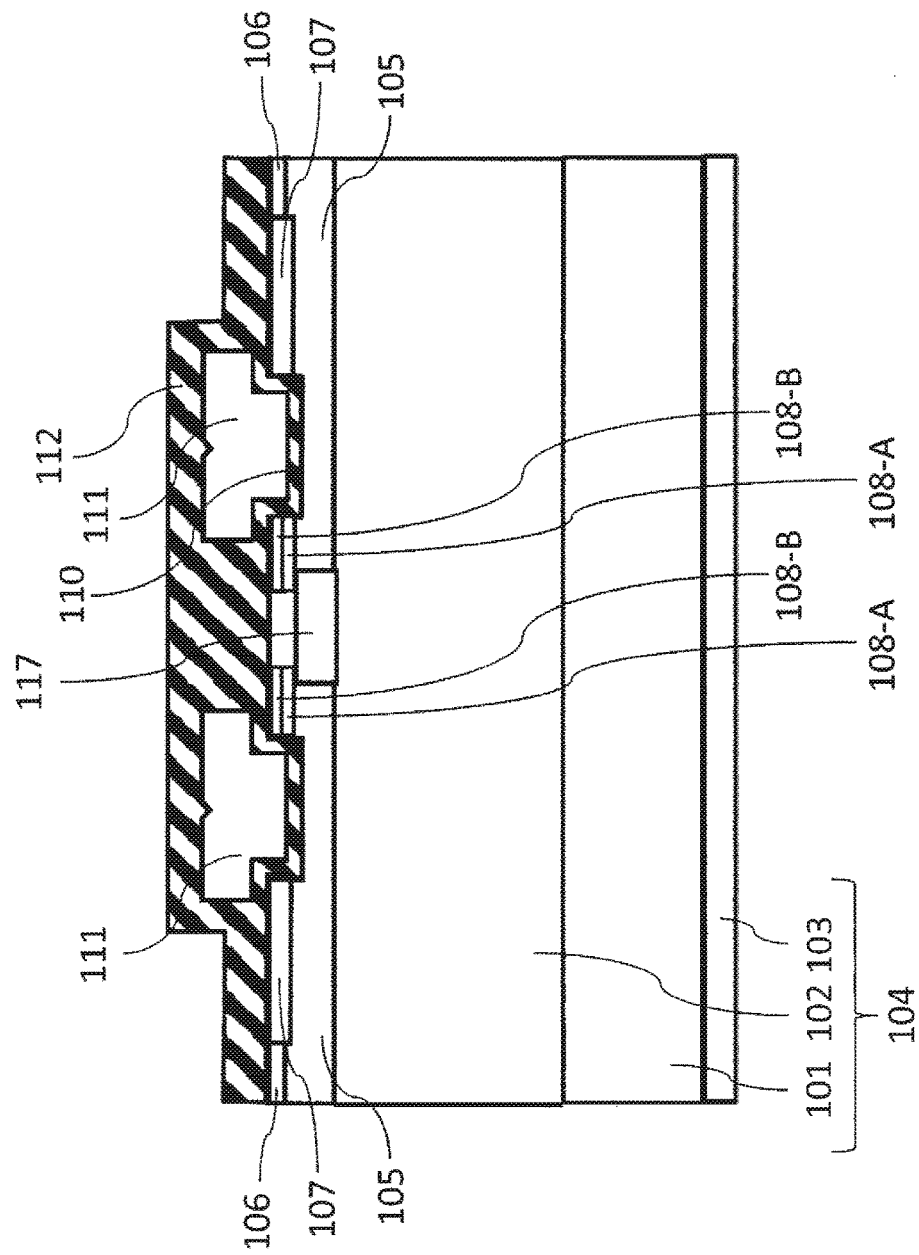
FIG. 14 is a sectional view showing the principal part of the silicon carbide semiconductor device in the same location as the location in FIG. 4 in the manufacturing process of the silicon carbide semiconductor device continuing from the FIG. 13.

Next, as shown in FIG. 14, a layer insulating film 112 is formed over the surface of the epitaxial layer 102 by the plasma-activated CVD method for example with the layer insulating film covering the gate electrode 111 and the gate insulating film 110.

Figure 15:
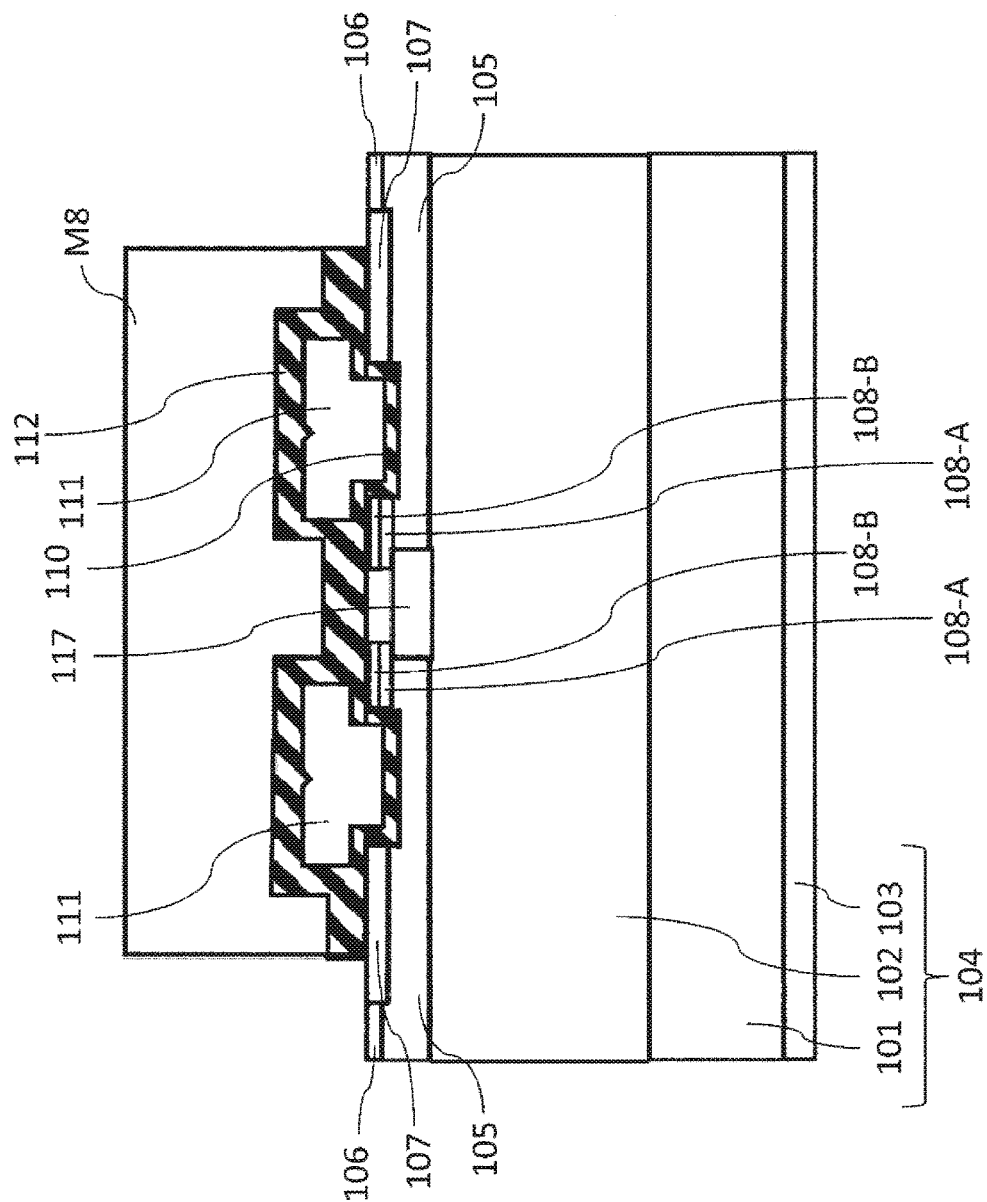
FIG. 15 is a sectional view showing the principal part of the silicon carbide semiconductor device in the same location as the location in FIG. 4 in the manufacturing process of the silicon carbide semiconductor device continuing from the FIG. 14.

Next, as shown in FIG. 15, the layer insulating film 112 and the gate insulating film 110 are etched by dry etching using a mask M8 (a photoresist film) and an opening CNT_S reaching a part of the n$^{++}$-type source area 107 and the p$^{++}$-type body layer electric potential fixing area 106 is formed.

Figure 16:
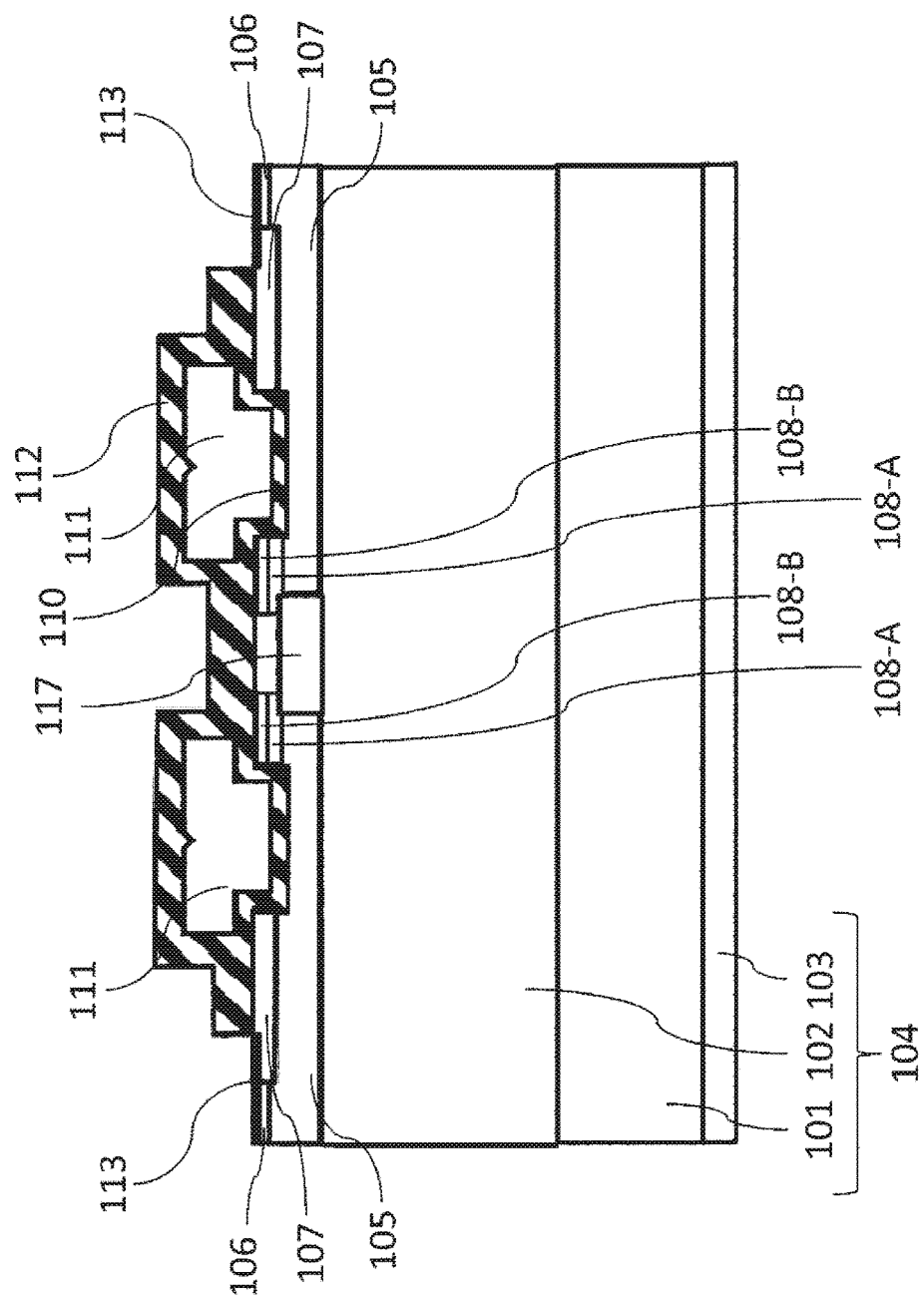
FIG. 16 is a sectional view showing the principal part of the silicon carbide semiconductor device in the same location as the location in FIG. 4 in the manufacturing process of the silicon carbide semiconductor device continuing from the FIG. 15.

Next, as shown in FIG. 16, after the mask M8 is removed, a metal silicide layer 113 is formed on respective surfaces of the part of the n$^{++}$-type source area 107 and the p$^{++}$-type body layer electric potential fixing area 106 respectively exposed at the bottom of the opening CNT_S.

First, nickel (Ni) for example as a first metal film is deposited over the surface of the epitaxial layer 102 by sputtering for example to cover the layer insulating film 112 and the inside (the side and the bottom) of the opening CNT_S though the above description is not shown. The thickness of the first metal film is approximately 0.05 μm, for example. Next, the first metal film and the epitaxial layer 102 are reacted at the bottom of the opening CNT_S by applying silicidation heat treatment at 600 to 1000° C. and a nickel silicide (NiSi) layer for example is formed as the metal silicide layer 113 on respective surfaces of the part of the n$^{++}$-type source area 107 and the p$^{++}$-type body layer electric potential fixing area 106 respectively exposed at the bottom of the opening CNT_S. Next, the unreacted first metal film is removed by wet etching. For the wet etching, sulfuric acid-hydrogen peroxide mixture liquid is used, for example.

Next, though the following is not shown, the layer insulating film 112 is etched using a mask (a photoresist film) and an opening CNT_G reaching the gate electrode 111 is formed.

Figure 17:
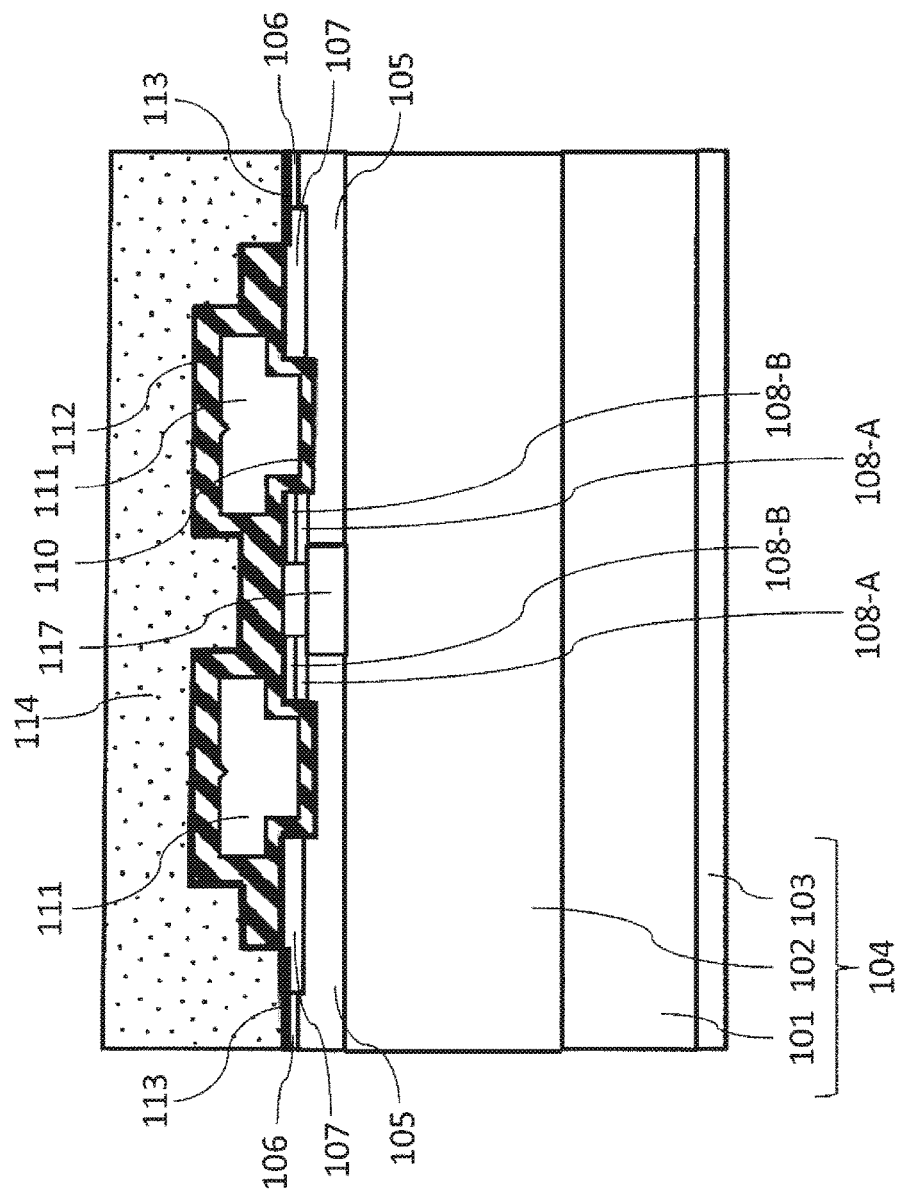
FIG. 17 is a sectional view showing the principal part of the silicon carbide semiconductor device in the same location as the location in FIG. 4 in the manufacturing process of the silicon carbide semiconductor device continuing from the FIG. 16.

Next, as shown in FIG. 17, a third metal film, for example, a laminated film configured by a titanium (Ti) film, a titanium nitride (TiN) film and an aluminum (Al) film is deposited on the layer insulating film 112 including the respective insides of the opening CNT_S reaching the metal silicide film 113 formed on the respective surfaces of the part of the $n^{++}$-type source area 107 and $p^{++}$-type body layer electric potential fixing area 106 and the opening CNT_G (not shown) reaching the gate electrode 111. It is desirable that thickness of the aluminum (Al) film is 2.0 µm or more, for example. Next, the electrode for source wiring 2 respectively electrically connected to the part of the $n^{++}$-type source area 107 and the $p^{++}$-type body layer electric potential fixing area 106 via the metal silicide layer 113 in the opening CNT_S and the electrode for gate wiring 8 electrically connected to the gate electrode 111 via the opening CNT_G are formed by etching the third metal film.

Next, though the following is not shown, an $SiO_2$ film or a polyimide film is deposited to cover the electrode for gate wiring 8 and the electrode for source wiring 2 as a passivation film.

Next, the passivation film is processed and the device is passivated though the above description is not shown. At that time, a source electrode opening 7 and a gate electrode opening 5 are formed.

Next, though the following is not shown, a second metal film is deposited on the back side of the $n^+$-type SiC substrate 101 by sputtering, for example. The thickness of the second metal film is approximately 0.1 µm, for example.

Figure 18:
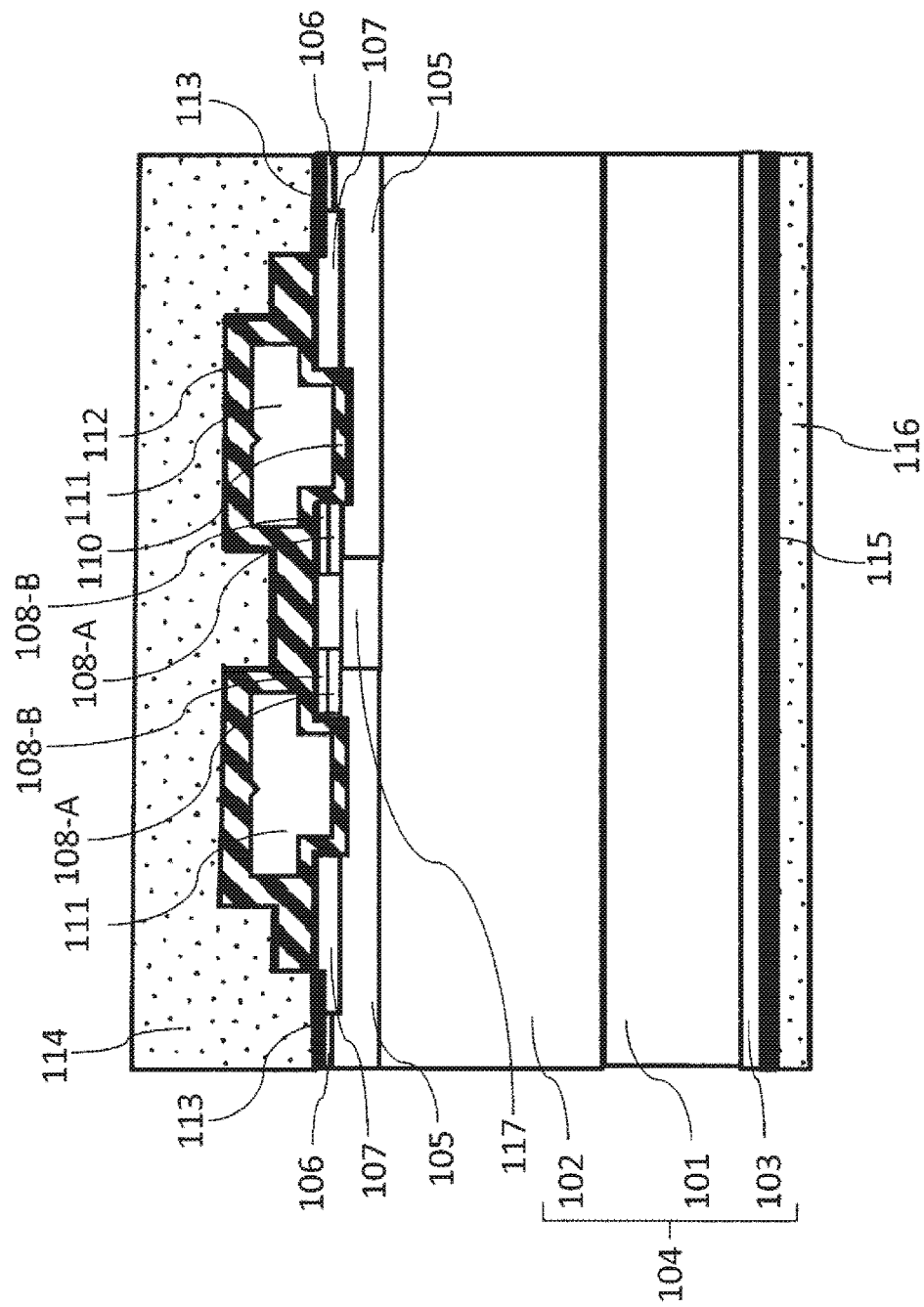
FIG. 18 is a sectional view showing the principal part of the silicon carbide semiconductor device in the same location as the location in FIG. 4 in the manufacturing process of the silicon carbide semiconductor device continuing from the FIG. 17.

Next, as shown in FIG. 18, the second metal film and the $n^+$-type SiC substrate 101 are reacted by applying laser silicidation heat treatment and a metal silicide layer 115 is formed with the metal silicide layer covering the $n^+$-type drain area 103 formed on the back side of the $n^+$-type SiC substrate 101. Next, an electrode for drain wiring 116 is formed with the electrode for drain wiring covering the metal silicide layer 115. For the electrode for drain wiring 116, a laminated film configured by a Ti film, an Ni film and a gold (Au) film is deposited by 0.5 to 1 µm.

Afterward, external wiring is respectively electrically connected to the electrode for source wiring 2, the electrode for gate wiring 8 and the electrode for drain wiring 116.

As described above, according to the first embodiment, since the side of the trench 109 functions as a channel area, a (11-20) crystalline plane and a (1-100) crystalline plane can be utilized for a channel plane when a 4°-off Si (0001) crystalline plane substrate is used, for example. Accordingly, higher channel mobility can be expected, compared with a channel area on the surface of the SiC substrate 101. Further, channel width is increased by forming the trenches 109, compared with the normal DMOS structure having no trench and lower channel resistance can be expected. Moreover, as the high-concentration JFET area 117 connects with the current diffused area 108-A, low JFET resistance can be expected.

Further, the trench 109 is formed in a shallower range than the depth of the p-type body layer 105 and furthermore, the downside of the bottom of the trench 109 is encircled by the p-type body layer 105. Accordingly, in this embodiment, an electric field applied to the gate insulating film formed on the surface of the trench in holding withstand voltage can be greatly subdued, compared with the normal trench-type MOS structure having a portion exposed from the p-type body layer. Furthermore, in this embodiment, the $p^+$-type gate insulating film protective layer 108-B is provided between the n-type high-concentration JFET area 117 and the gate electrode 111. Hereby, an oxide film electric field over the n-type high-concentration JFET area 117 can be greatly subdued. Further, in this embodiment, the end of the gate electrode 111 is formed over the $p^+$-type gate insulating film protective layer 108-B. Accordingly, a gate insulating film electric field applied at a power-off time can be further greatly subdued, compared with the normal DMOS structure. Furthermore, in this embodiment, capacitance between the gate electrode 111 and the $n^-$-type epitaxial layer 102 can be reduced and not only conduction loss but switching loss can also be reduced. Consequently, the lower-loss and more reliable silicon carbide semiconductor device than the normal DMOS structure and its manufacturing method can be provided.

Second Embodiment

Figure 19:
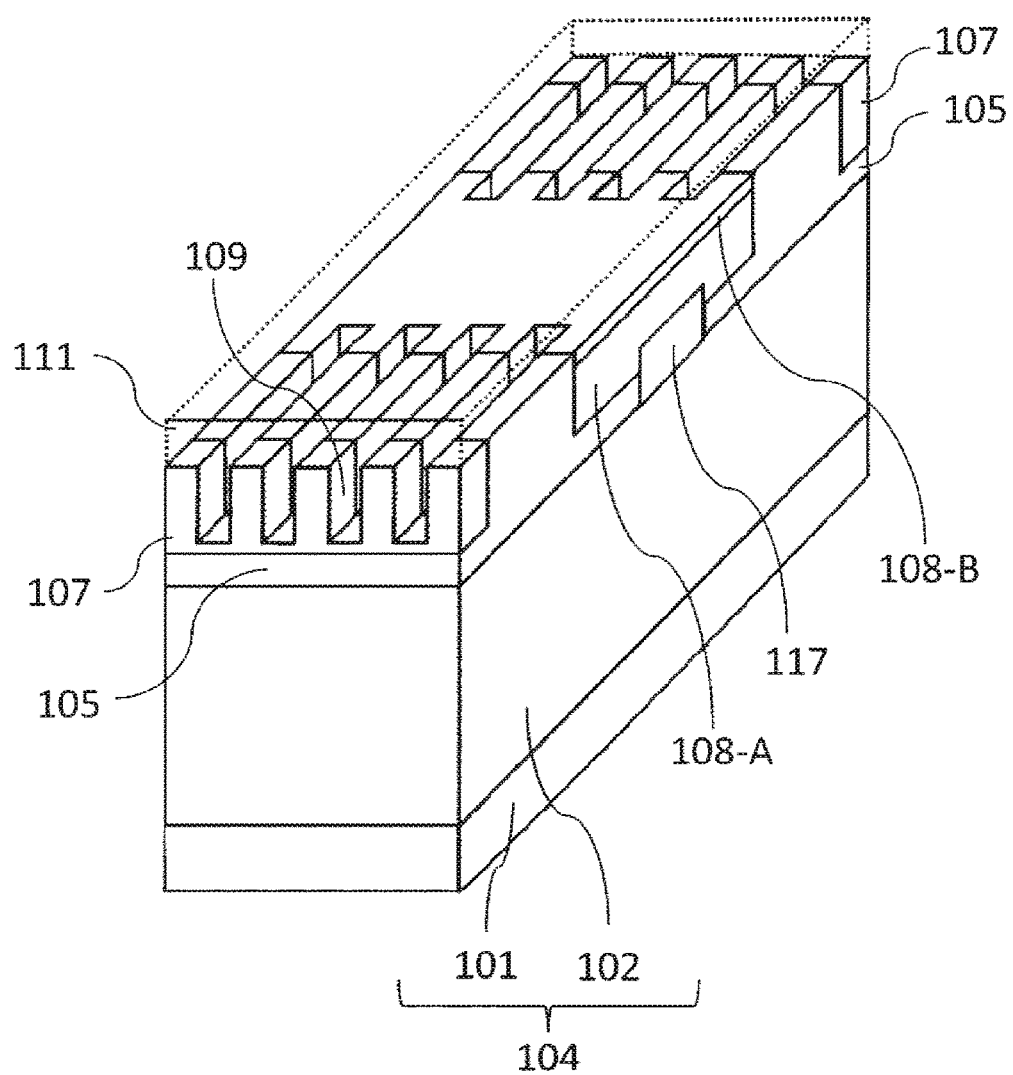
FIG. 19 is a bird's-eye view showing a principal part of SiC power MISFET in a second embodiment of the present invention.

A second embodiment is different from the first embodiment in that the whole JFET area on the upside of a high-concentration JFET area 117 is covered with a current diffused area 108-A, a gate insulating film protective area 108-B and a gate electrode 111 as shown in a bird'-eye view showing a principal part of SiC power MISFET shown in FIG. 19. Since the structure that the gate electrode 111 covers the whole JFET area is adopted, the area of the gate electrode 111 over a chip is enlarged and gate resistance can be reduced. Further, the gate insulating film protective area 108-B covers the whole JFET area, and a gate insulating film electric field applied at a power-off time can be reduced.

Furthermore, since the gate insulating film protective area 108-B exists, capacitance between the gate electrode 111 and an $n^-$-type epitaxial layer 102 can be reduced without making the gate electrode 111 and the $n^-$-type epitaxial layer 102 opposite in the JFET area, and no new switching loss is caused. Accordingly, the second embodiment can lower gate resistance, maintaining loss and reliability, compared with the first embodiment, and further high-speed switching is enabled.

<<Manufacturing Method of Silicon Carbide Semiconductor Device>>

A manufacturing method of a silicon carbide semiconductor device in the second embodiment will be described referring to FIGS. 20 to 31 in the order of processes below. FIGS. 20 to 31 show a part of an SiC power MISFET forming area (a device forming area) of the silicon carbide semiconductor device in this embodiment with the area enlarged.

Figure 20:
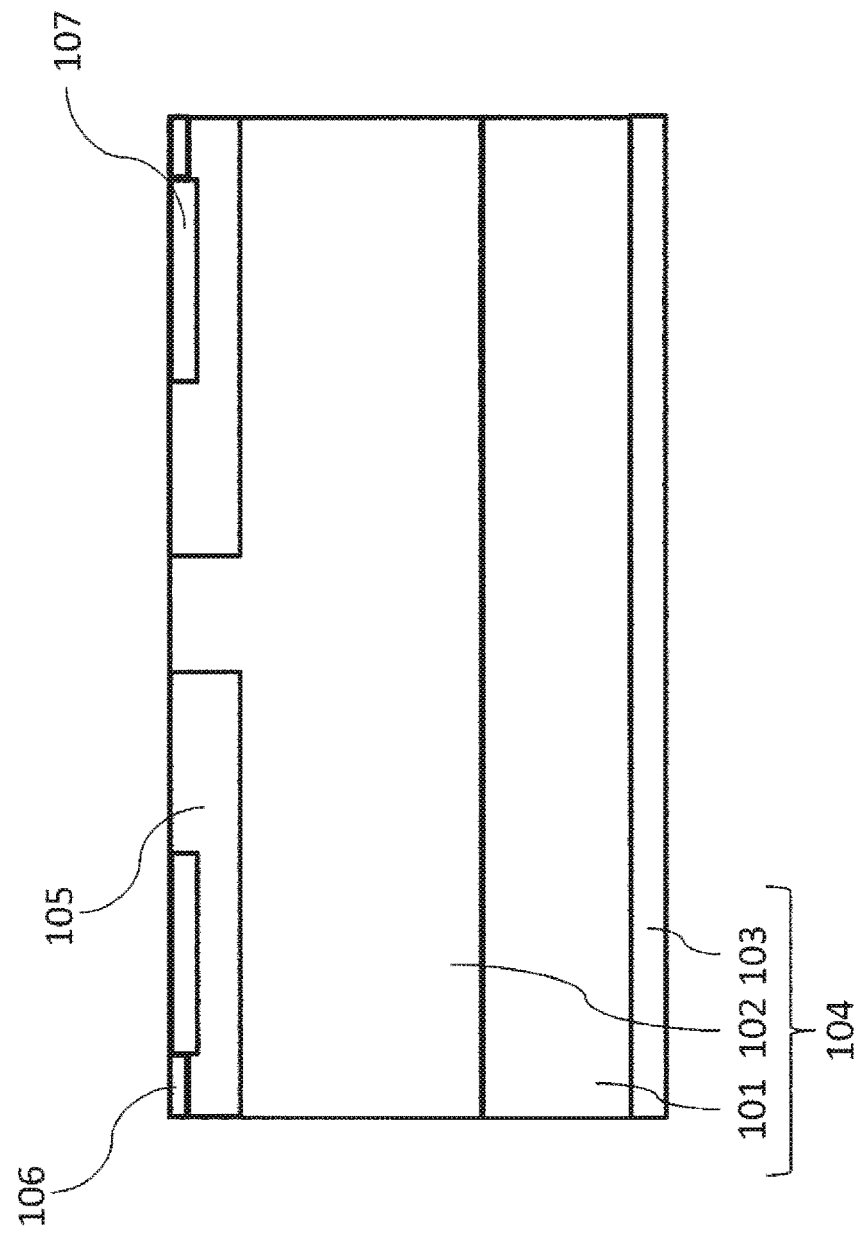
FIG. 20 is a sectional view showing the principal part of the silicon carbide semiconductor device for explaining a manufacturing process of the silicon carbide semiconductor device in the second embodiment of the present invention.

Similarly to the first embodiment, as shown in FIG. 20, then $n^-$-type epitaxial layer 102 is formed on a surface (a first principal surface) of an $n^+$-type SiC substrate 101 and an SiC epitaxial substrate 104 provided with the $n^+$-type SiC substrate 101 and the $n^-$-type epitaxial layer 102 is formed. The impurity concentration of the $n^+$-type SiC substrate 101 is in a range of $1\times10^{18}$ to $1\times10^{21}$ $cm^{-3}$ for example and the impurity concentration of the $n^-$-type epitaxial layer 102 is in a range of $1\times10^{14}$ to $1\times10^{17}$ $cm^{-3}$. Next, an $n^+$-type drain area 103 is formed on the back side (a second principal surface) of the $n^+$-type SiC substrate 101. Impurity concentration of the $n^+$-type drain area 103 is in a range of $1\times10^{19}$ to $1\times10^{21}$ $cm^{-3}$, for example.

Next, p-type impurities, for example, aluminum atoms (Al) are ion-implanted in the n⁻-type epitaxial layer 102 from the upside of a mask (not shown in FIG. 20). Hereby, a p-type body layer 105 is formed in a device forming area of the epitaxial layer 102. Though the following is not shown in FIG. 20, p-type floating field limiting rings are simultaneously formed in a circumference of the device forming area. Impurity concentration of the p-type body layer 105 is in a range of $1×10^{16}$ to $1×10^{19}$ cm$^{-3}$, for example.

Next, p-type impurities, for example, aluminum atoms (Al) are ion-implanted in the epitaxial layer 102 from the upside of the mask (not shown in FIG. 20). Hereby, a p$^{++}$-type body layer electric potential fixing area 106 is formed in the p-type body layer 105. The impurity concentration of the p$^{++}$-type body layer electric potential fixing area 106 is in a range of $1×10^{19}$ to $1×10^{21}$ cm$^{-3}$, for example.

Next, nitrogen atoms (N) as n-type impurities are ion-implanted in the epitaxial layer 102 from the upside of the mask and an n$^{++}$-type source area 107 is formed in the device forming area (not shown). The impurity concentration of the n$^{66}$-type source area 107 is in a range of $1×10^{19}$ to $1×10^{21}$ cm$^{-3}$, for example. Afterward, the mask is removed.

Figure 21:
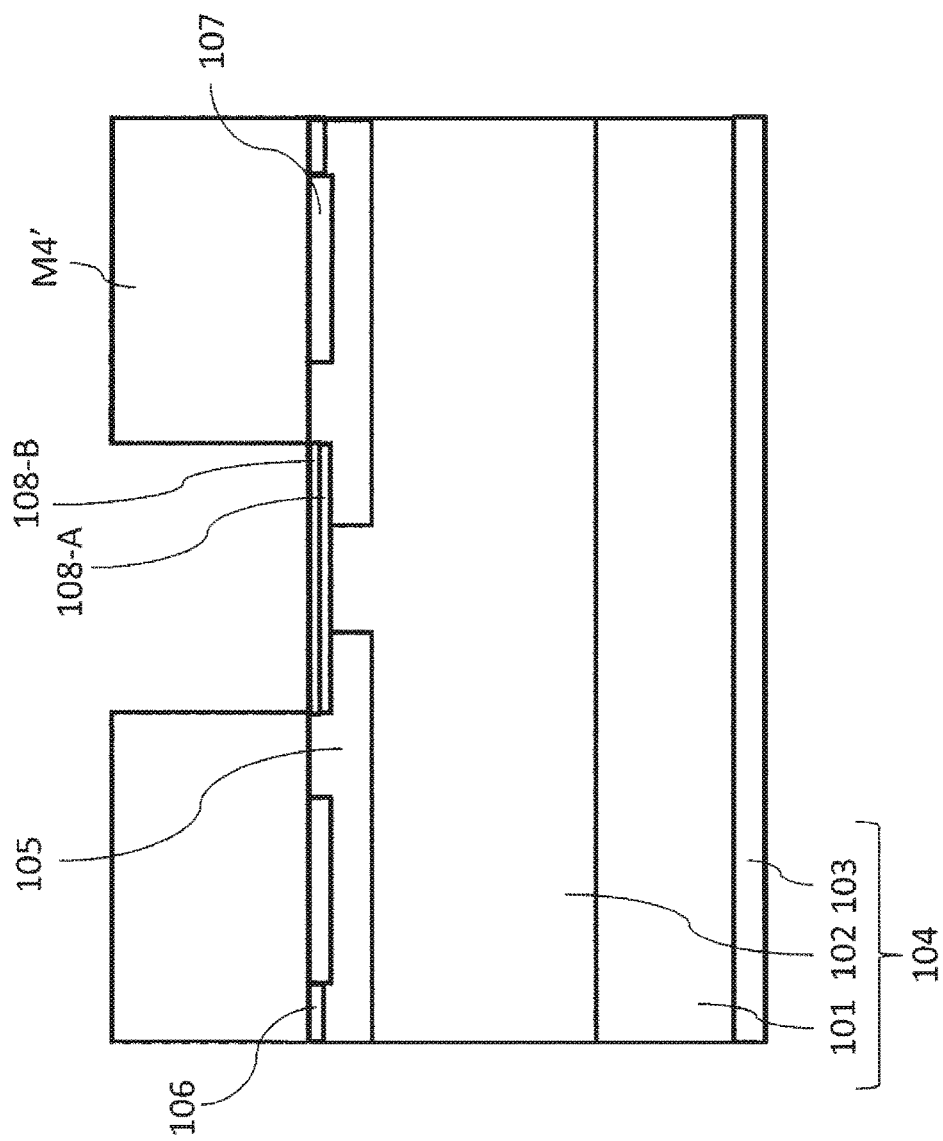
FIG. 21 is a sectional view showing the principal part of the silicon carbide semiconductor device continuing from FIG. 20.
Figure 22:
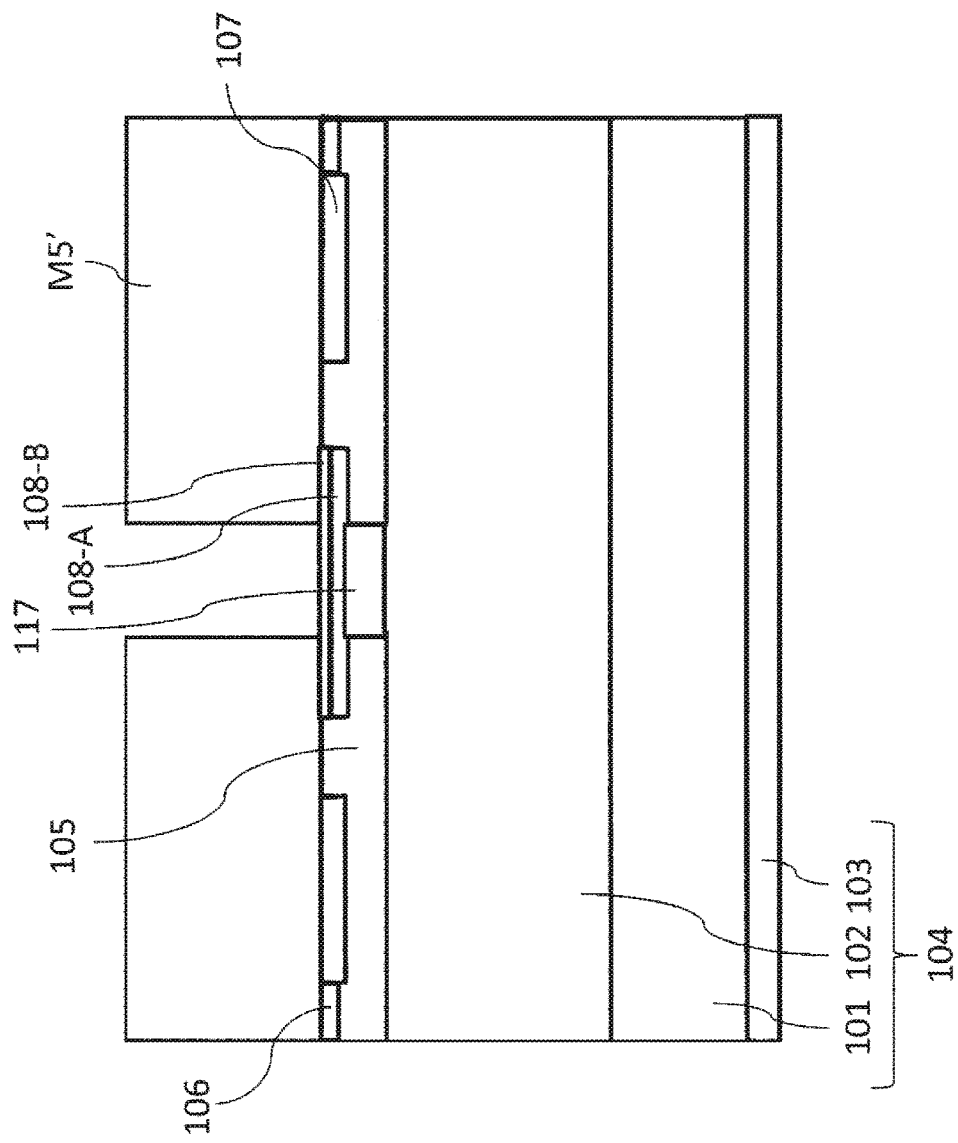
FIG. 22 is a sectional view showing the principal part of the silicon carbide semiconductor device continuing from FIG. 21.

Next, as shown in FIG. 21, a mask M4' is formed by a resist film, for example. The thickness of the mask M4' is approximately 0.5 to 3 μm, for example. An opening is provided to an area where an n$^+$-type current diffused area 108-A is to be formed in a posterior process of the mask M4'.

Next, nitrogen atoms (N) as n-type impurities are ion-implanted in the epitaxial layer 102 from the upside of the mask M4' and the n$^+$-type current diffused area 108-A is formed in the device forming area. The depth (fourth depth) from a surface of the epitaxial layer 102 of the n$^+$-type current diffused area 108-A is approximately 0.1 to 0.7 μm, for example. Further, the impurity concentration of the n$^+$-type current diffused area 108-A is in a range of $5×10^{16}$ to $5×10^{18}$ cm$^{-3}$, for example. The second embodiment is different from the first embodiment in that the n$^+$-type current diffused area 108-A is formed on the whole JFET area.

Next, aluminum atoms (Al) as p-type impurities are ion-implanted in the epitaxial layer 102 from the upside of the mask M4' and a p$^+$-type gate insulating film protective area 108-B is formed in the device forming area. The depth (fifth depth) from the surface of the epitaxial layer 102 of the p$^+$-type gate insulating film protective area 108-B is approximately 0.05 to 0.3 μm, for example. Further, the impurity concentration of the p$^+$-type gate insulating film protective area 108-B is in a range of $5×10^{16}$ to $5×10^{18}$ cm$^{-3}$, for example. The second embodiment is different from the first embodiment in that the p$^+$-type gate insulating film protective area 108-B is formed on the whole JFET area.

Next, after the mask M4' is removed, a mask M5' is formed by a resist film, for example. Thickness of the mask M5' is approximately 0.5 to 3 μm, for example. An opening is provided to an area where the n-type high-concentration JFET area 117 is to be formed in the posterior process of the mask M5'. Further, the opening of the mask M5' is overlapped with the opening of the mask M4'.

Next, nitrogen atoms (N) as n-type impurities are ion-implanted in the epitaxial layer 102 from the upside of the mask M5' and the n-type high-concentration JFET area 117 is formed in the device forming area. The depth (sixth depth) of an upper part of the n-type high-concentration JFET area 117 is shallower than the fourth depth and for example, the depth is approximately 0.1 to 0.7 μm. The depth (seventh depth) of a lower part of the n-type high-concentration JFET area 117 is similar to the depth (first depth) of the p-type body layer 105 and for example, the depth is approximately 0.5 to 2.0 μm. Hereby, the n-type high-concentration JFET area 117 is formed up to a deeper area than the n$^+$-type current diffused area 108-A. Further, since the opening of the mask M5' is overlapped with the opening of the mask M4', the n-type high-concentration JFET area 117 is in contact with the n$^+$-type current diffused area 108-A and the JFET area is electrically connected to the current diffused area. Moreover, the impurity concentration of the n-type high-concentration JFET area 117 is in a range of $1×10^{16}$ to $1×10^{17}$ cm$^{-3}$, for example.

Next, after the mask M5' is removed, a carbon (C) film is deposited on the surface and the back side of the SiC epitaxial substrate 104 by a plasma-activated CVD method for example though the above description is not shown. The thickness of the carbon (C) film is approximately 0.03 μm, for example. After the surface and the back side of the SiC epitaxial substrate 104 are covered with the carbon (C) film, heat treatment at 1500° C. or more is applied to the SiC epitaxial substrate 104 for approximately 2 to 3 minutes. Hereby, each impurity ion-implanted in the SiC epitaxial substrate 104 is activated. After the heat treatment, the carbon (C) film is removed by oxygen plasma treatment, for example.

Figure 23A:
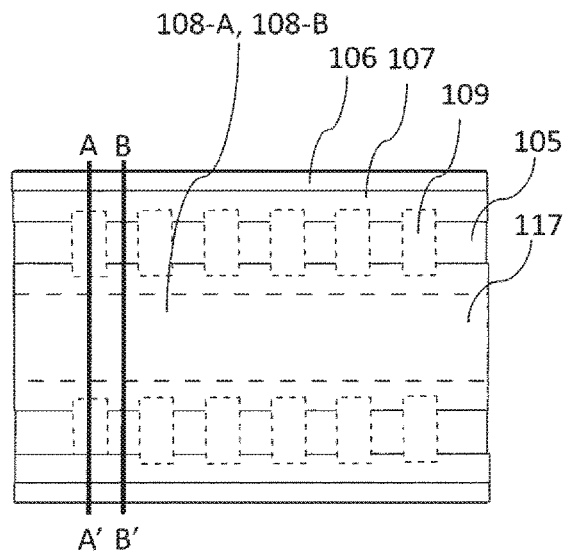
FIG. 23($a$) is a top view showing the principal part of the silicon carbide semiconductor device in the manufacturing process continuing from FIG. 22.
Figure 23B:
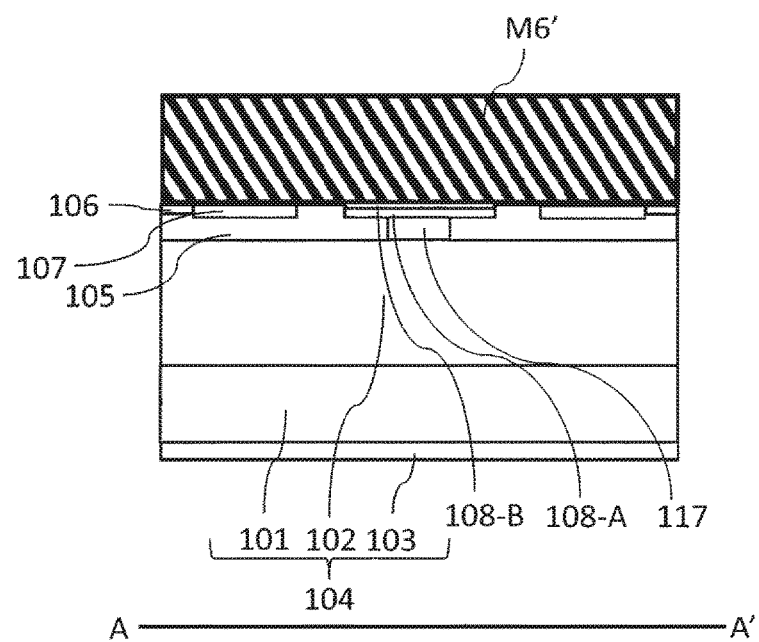
Figure 23C:
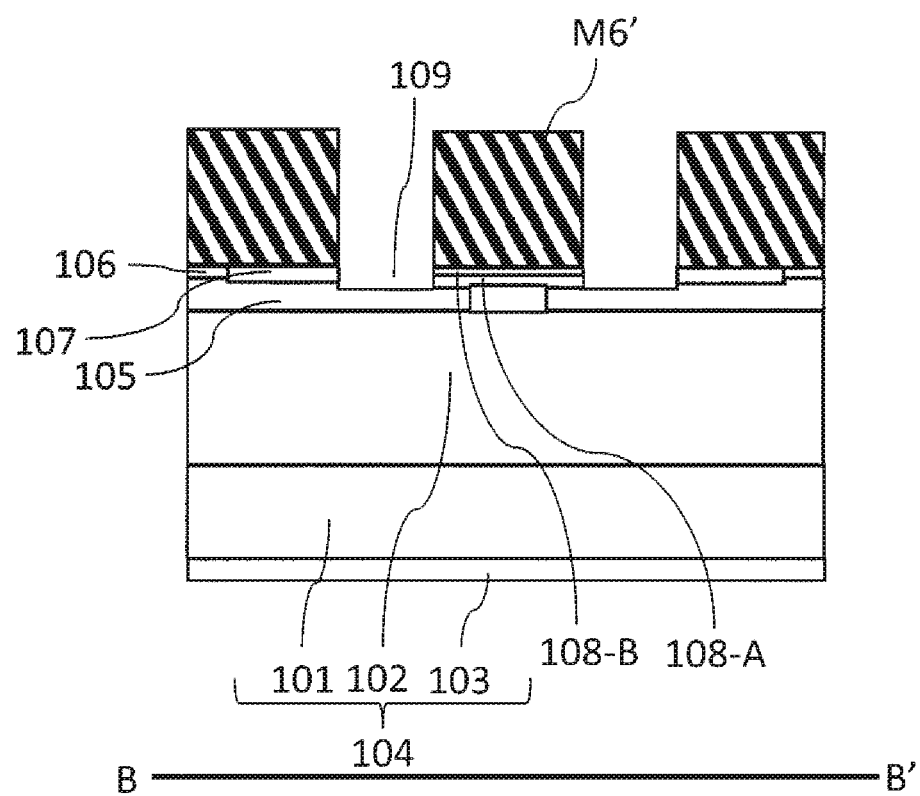

Next, as shown in FIGS. 23(b) and 23(c), a mask M6' is formed by a resist film, for example. FIG. 23(a) is a top view showing the principal part, FIG. 23(b) is a sectional view showing the principal part viewed along a line AA' in FIG. 23(a), and FIG. 23(c) is a sectional view showing the principal part viewed along a line BB' in FIG. 23(a). The thickness of the mask M6' is approximately 0.5 to 3 μm, for example. An opening is provided to an area where a trench 109 is to be formed in the posterior process of the mask M6'.

Next, the trench 109 is formed in the p-type body layer 105 using a dry etching process. The depth of the trench is approximately 0.1 to 1.5 μm, for example. The length in a direction parallel to channel length of the trench is approximately 1 to 3 μm, for example. Length in a direction parallel to channel width of the trench is approximately 0.1 to 1 μm, for example. An interval between the trenches in the direction parallel to the channel width is approximately 0.1 to 1 μm, for example.

Figure 24:
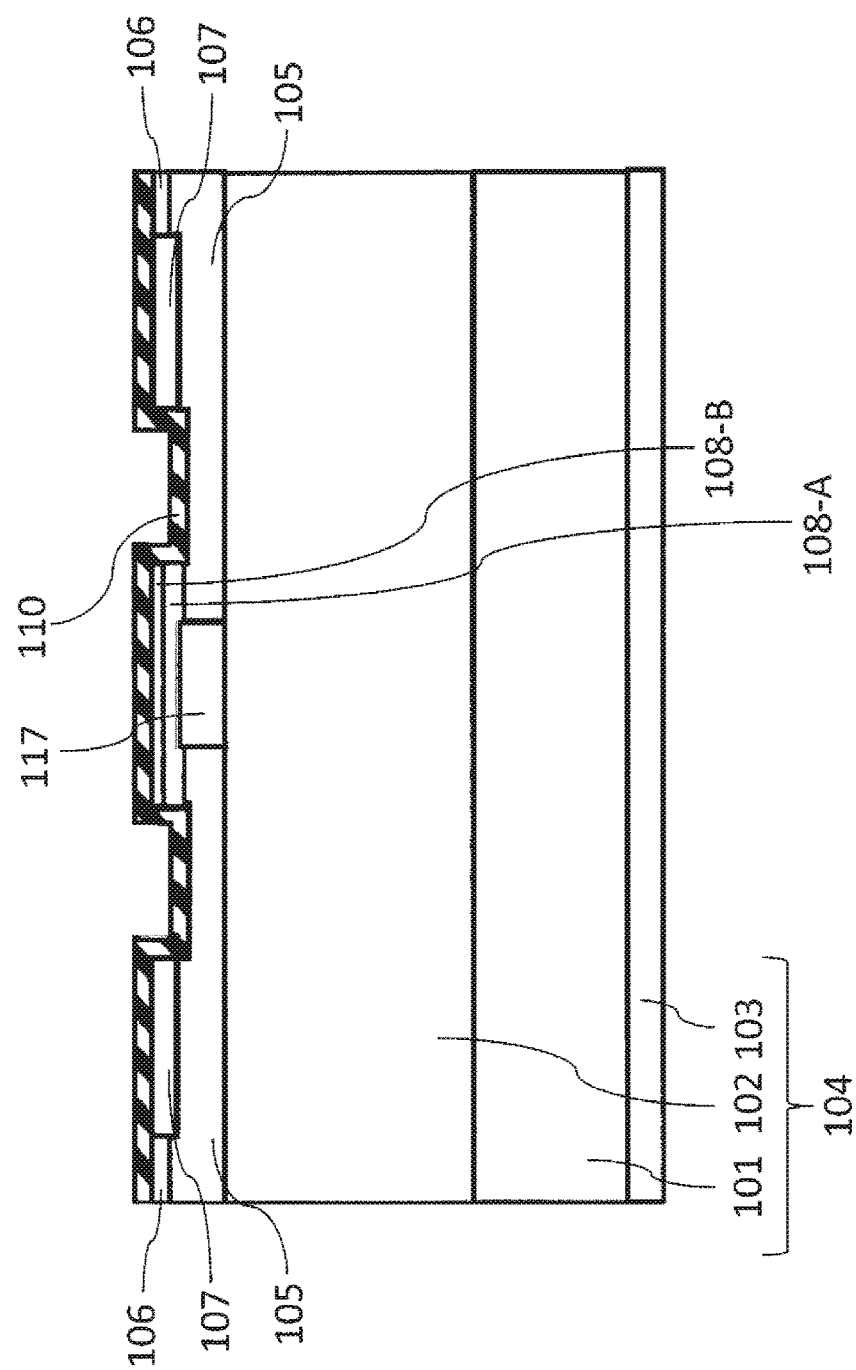
FIG. 24 is a sectional view showing the principal part of the silicon carbide semiconductor device in the manufacturing process continuing from FIGS. 23($a$) to ($c$).

Next, as shown in FIG. 24, after the mask M6' is removed, a gate insulating film 110 is formed on the surface of the epitaxial layer 102 and a surface of the trench 109. The gate insulating film 110 is an SiO$_2$ film formed by heat CVD treatment, for example. The thickness of the gate insulating film 110 is approximately 0.005 to 0.15 μm, for example.

Figure 25:
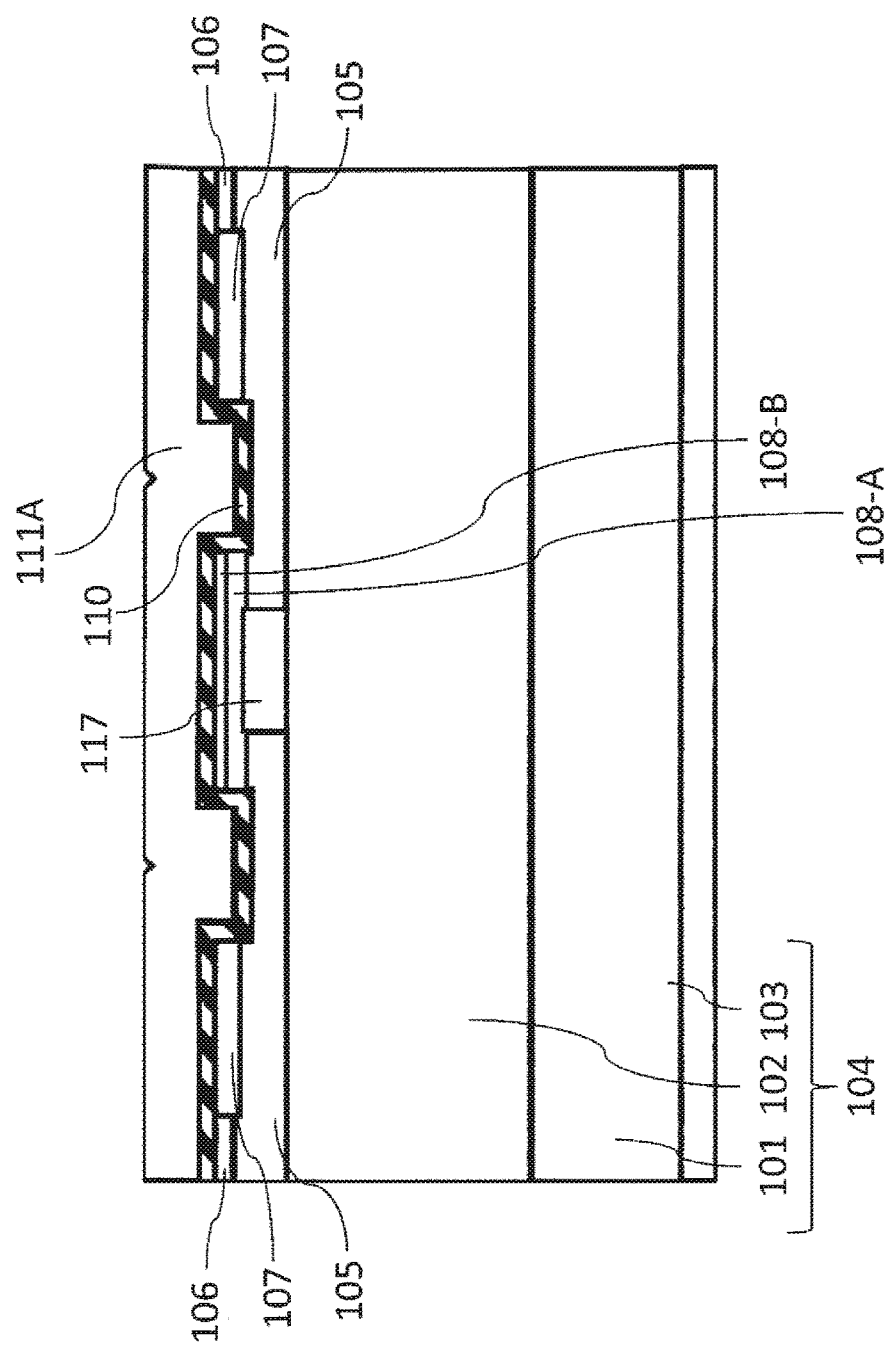
FIG. 25 is a sectional view showing the principal part of the silicon carbide semiconductor device in the manufacturing process continuing from FIG. 24.

Next, as shown in FIG. 25, an n-type polycrystalline silicon (Si) film 111A is formed on the gate insulating film 110. The thickness of the n-type polycrystalline silicon (Si) film 111A is approximately 0.01 to 4 μm, for example.

Figure 26:
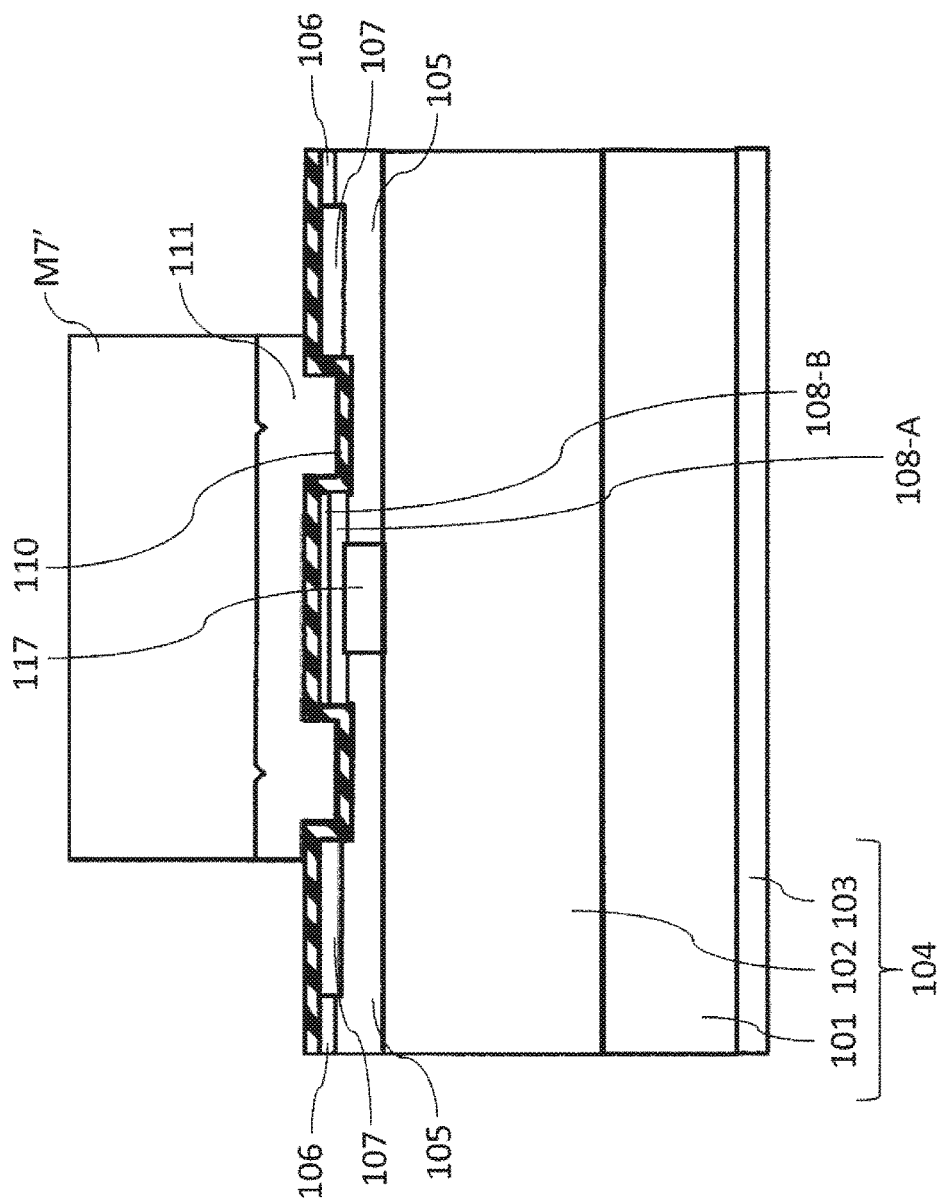
FIG. 26 is a sectional view showing the principal part of the silicon carbide semiconductor device in the manufacturing process continuing from FIG. 25.

Next, as shown in FIG. 26, the polycrystalline silicon (Si) film 111A is etched by dry etching using a mask M7' (a photoresist film) and a gate electrode 111 is formed. Next, though the following is not shown in FIG. 26, after the mask M7' is removed, the gate electrode 111 is lightly oxidized and for a condition, the gate electrode is oxidized by dry oxidation at 900° C. for approximately 30 minutes, for example.

Figure 27:
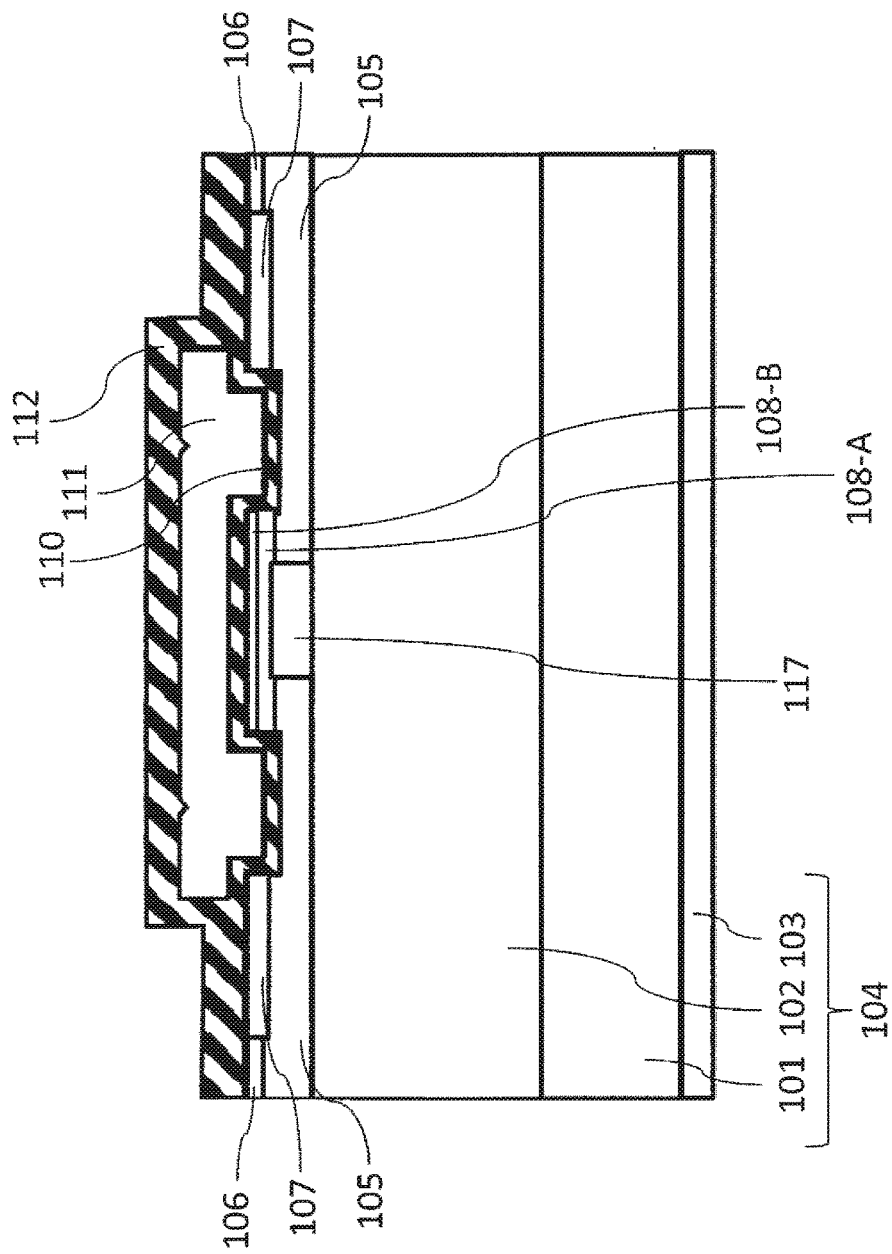
FIG. 27 is a sectional view showing the principal part of the silicon carbide semiconductor device in the manufacturing process continuing from FIG. 26.

Next, as shown in FIG. 27, a layer insulating film 112 is formed by the plasma-activated CVD method for example with the layer insulating film 112 covering the gate electrode 111 and the gate insulating film 110 over the surface of the epitaxial layer 102.

Figure 28:
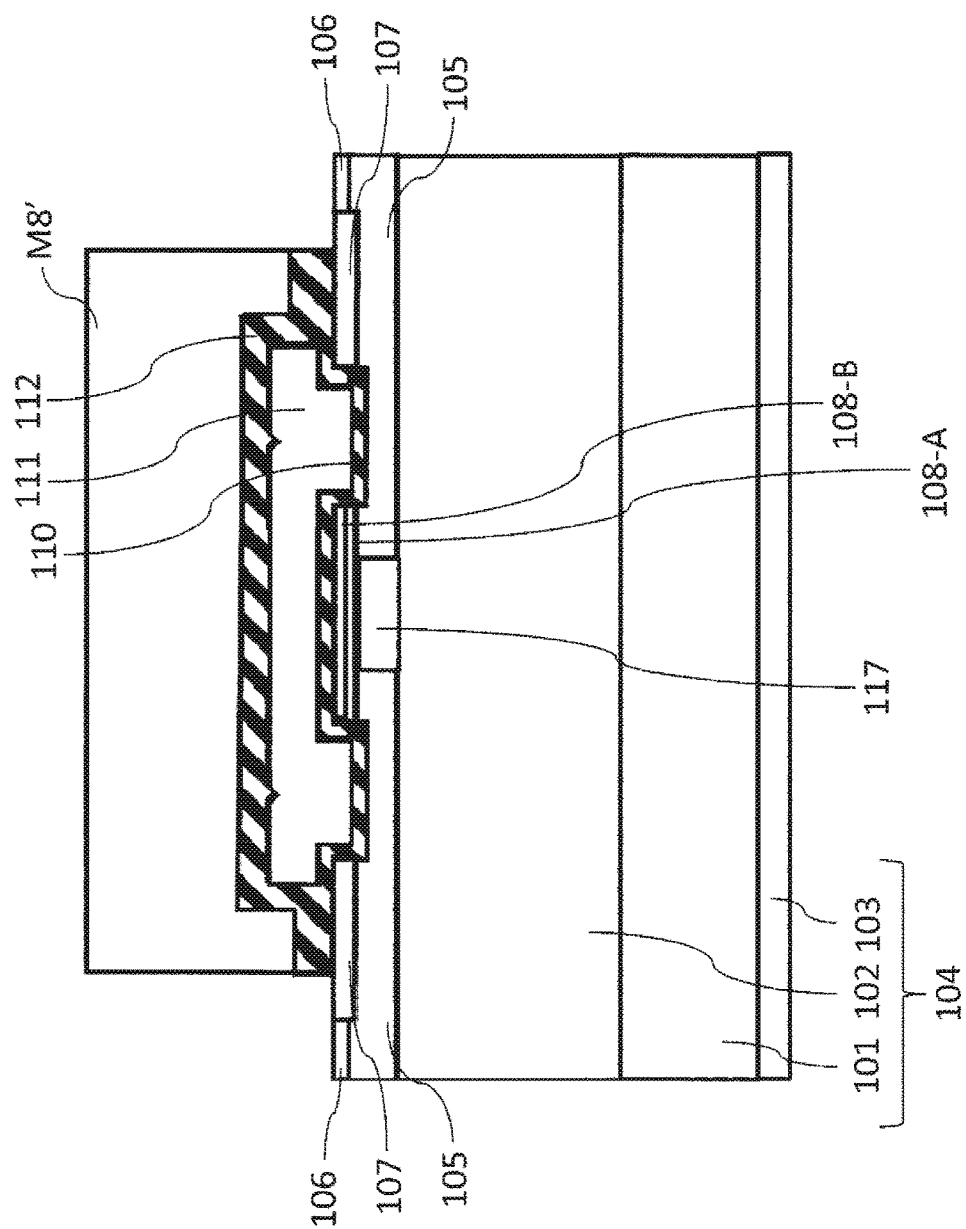
FIG. 28 is a sectional view showing the principal part of the silicon carbide semiconductor device in the manufacturing process continuing from FIG. 27.

Next, as shown in FIG. 28, the layer insulating film 112 and the gate insulating film 110 are etched by dry etching using a mask M8' (a photoresist film) and an opening CNT_S reaching apart of the $n^{++}$-type source area 107 and the $p^{++}$-type body layer electric potential fixing area 106 is formed.

Figure 29:
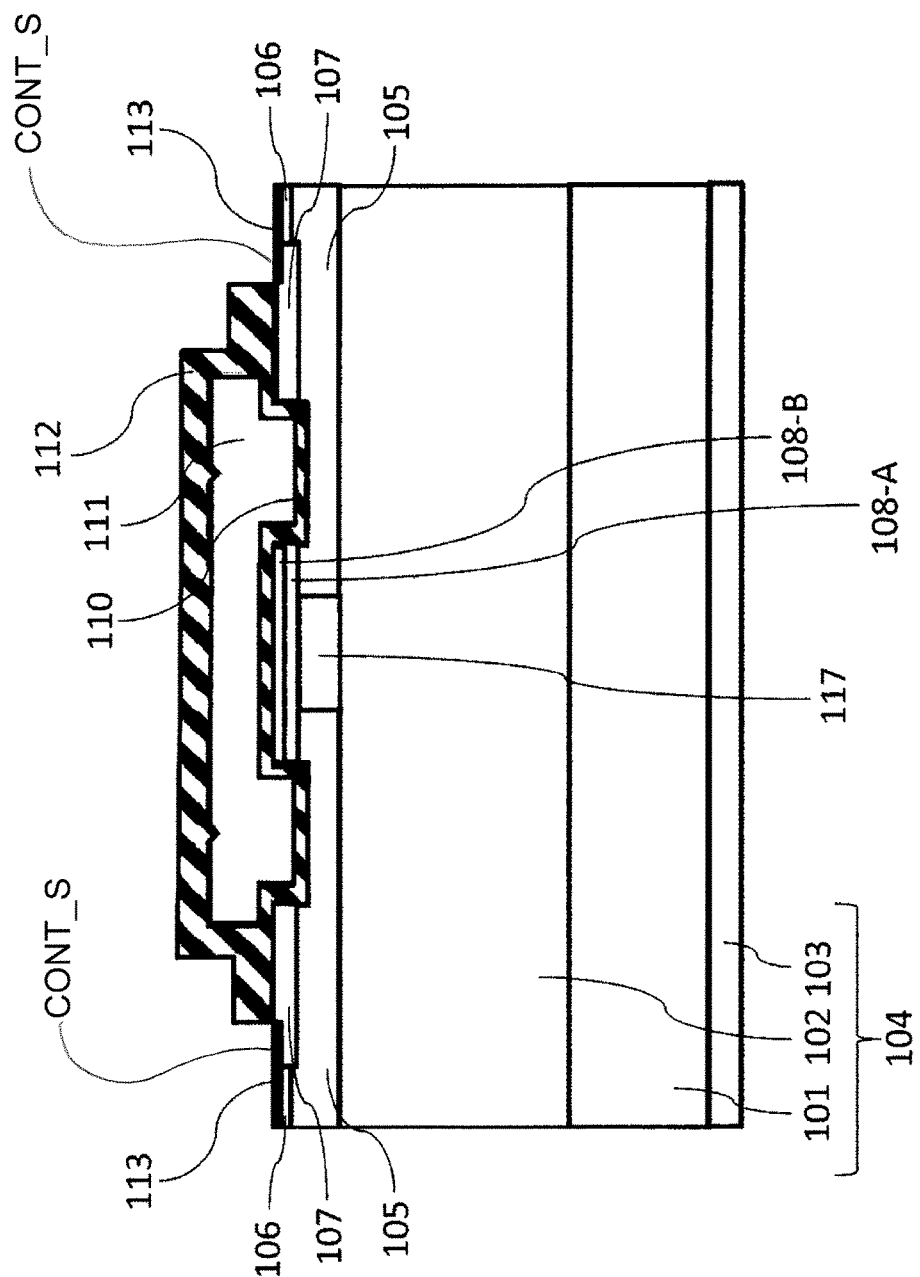
FIG. 29 is a sectional view showing the principal part of the silicon carbide semiconductor device in the manufacturing process continuing from FIG. 28.

Next, as shown in FIG. 29, after the mask M8' is removed, a metal silicide layer 113 is formed on respective surfaces of the part of the $n^{++}$-type source area 107 and the $p^{++}$-type body layer electric potential fixing area 106 respectively exposed at the bottom of the opening CNT_S. First, though the following is not shown in FIG. 29, a first metal film, for example, nickel (Ni) is deposited by sputtering for example with the layer insulating film 112 and the inside (the side and the bottom) of the opening CNT_S covered over the surface of the epitaxial layer 102. The thickness of the first metal film is approximately 0.05 µm, for example. Next, the first metal film and the epitaxial layer 102 are reacted at the bottom of the opening CNT_S by applying silicidation heat treatment at 600 to 1000° C., and as the metal silicide layer 113, for example, a nickel silicide (NiSi) layer is formed on the respective surfaces of the part of the $n^{++}$-type source area 107 and the $p^{++}$-type body layer electric potential fixing area 106 respectively exposed at the bottom of the opening CNT_S. Next, the unreacted first metal film is removed by wet etching. For wet etching, sulfuric acid-hydrogen peroxide mixture liquid for example is used.

Next, though the following is not shown, the layer insulating film 112 is etched using a mask (a photoresist film) and an opening CNT_G reaching the gate electrode 111 is formed.

Figure 30:
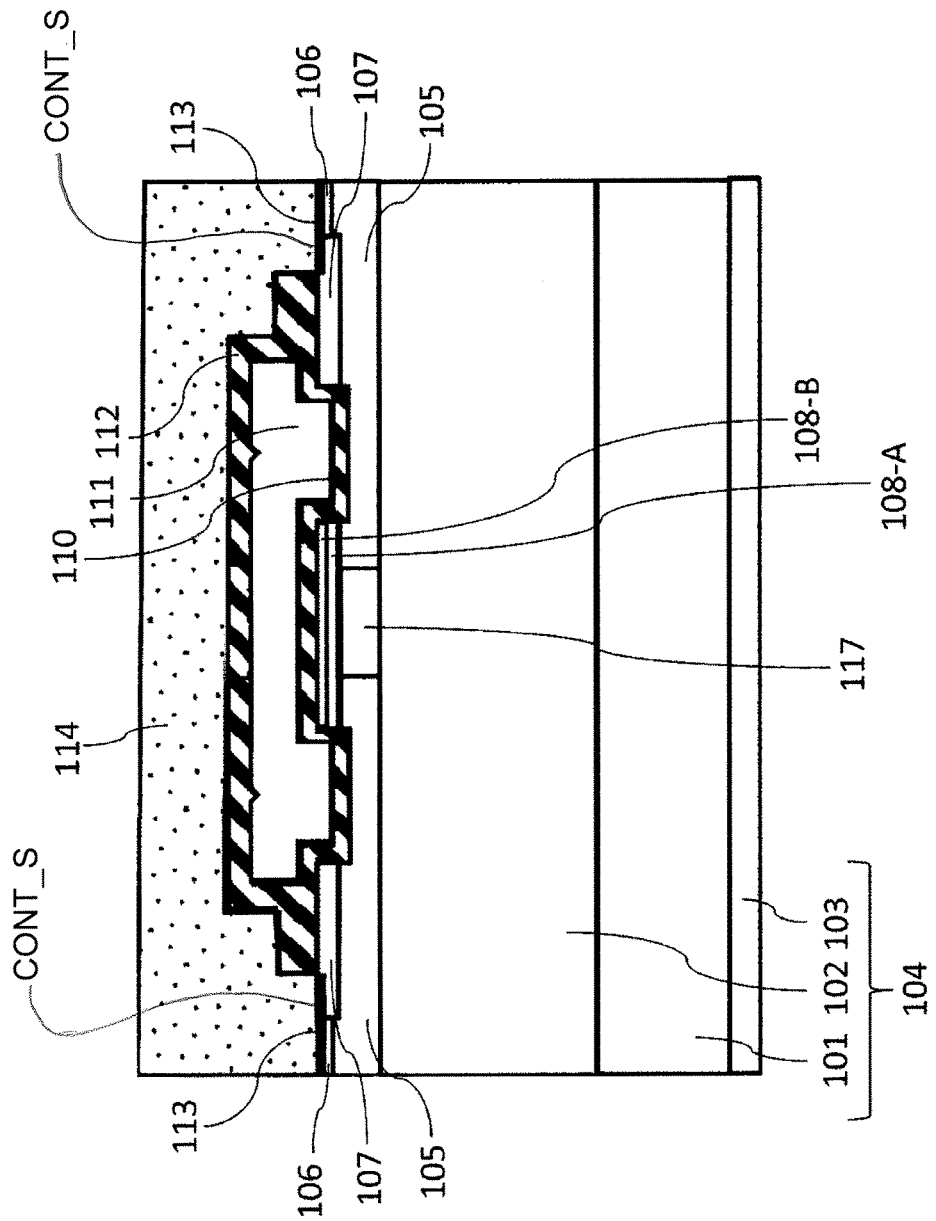
FIG. 30 is a sectional view showing the principal part of the silicon carbide semiconductor device in the manufacturing process continuing from FIG. 29.

Next, as shown in FIG. 30, for a third metal film, a laminated film configured by a titanium (Ti) film, a titanium nitride (TiN) film and an aluminum (Al) film for example is deposited on the layer insulating film 112 including the respective insides of the opening CNT_S reaching the metal silicide film 113 formed on the respective surfaces of the part of the $n^{++}$-type source area 107 and the $p^{++}$-type body layer electric potential fixing area 106 and the opening CNT_G (not shown) reaching the gate electrode 111. It is desirable that thickness of the aluminum (Al) film is 2.0 µm or more, for example. Next, an electrode for source wiring 2 electrically connected to the part of the $n^{++}$-type source area 107 and the $p^{++}$-type body layer electric potential fixing area 106 via the metal silicide layer 113 in the opening CNT_S and an electrode for gate wiring 8 electrically connected to the gate electrode 111 via the opening CNT_G are formed by processing the third metal film.

Next, though the following is not shown, an $SiO_2$ film or a polyimide film is deposited to cover the electrode for gate wiring 8 and the electrode for source wiring 2 as a passivation film. Next, though the following is not shown, passivation is completed by processing the passivation film. At that time, a source electrode opening 7 and a gate electrode opening 5 are formed.

Next, though the following is not shown, a second metal film is deposited on the back side of the $n^+$-type SiC substrate 101 by sputtering, for example. The thickness of the second metal film is approximately 0.1 µm, for example.

Figure 31:
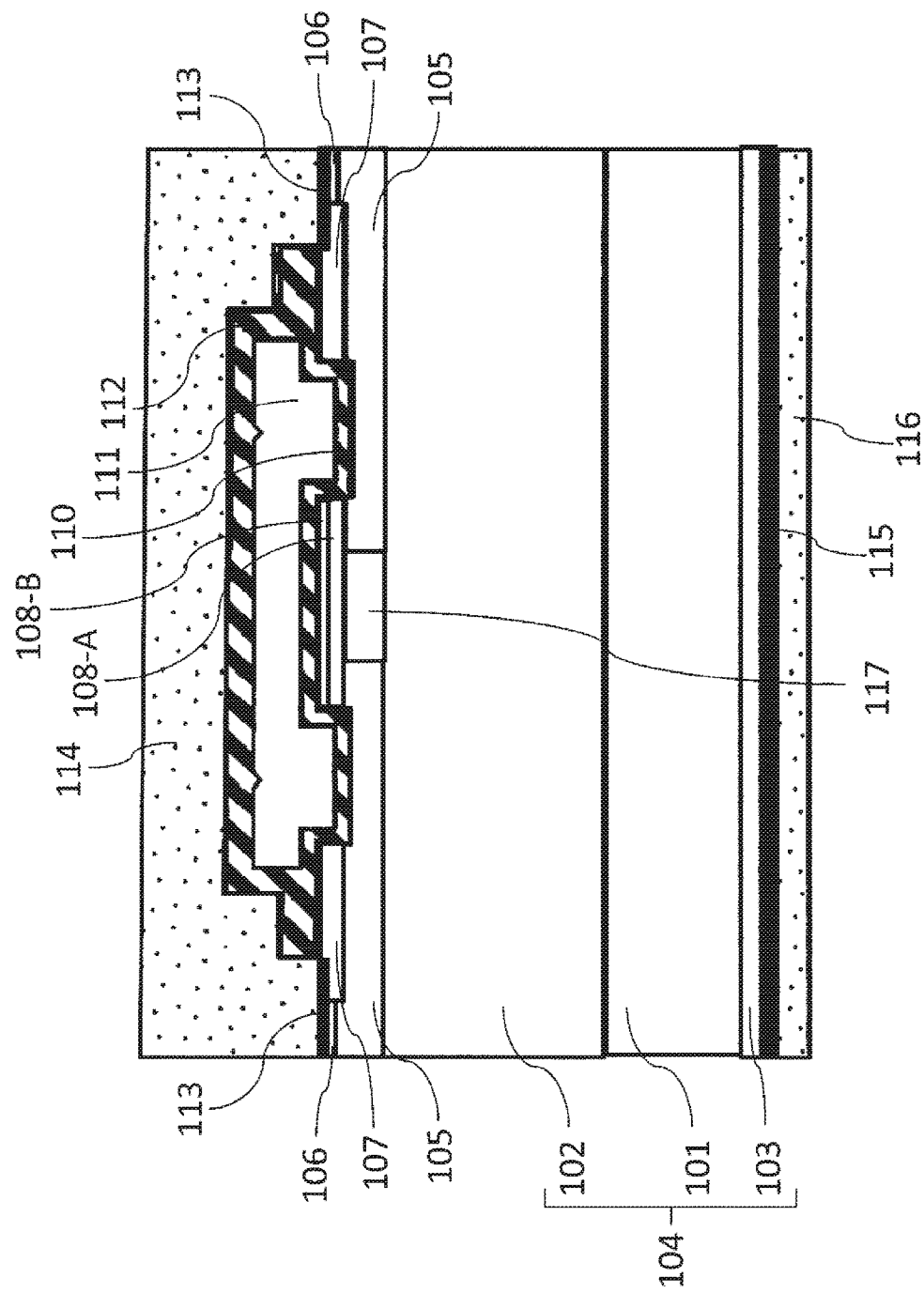
FIG. 31 is a sectional view showing the principal part of the silicon carbide semiconductor device in the manufacturing process continuing from FIG. 30.

Next, as shown in FIG. 31, the second metal film and the $n^+$-type SiC substrate 101 are reacted by applying laser silicidation heat treatment, and a metal silicide layer 115 is formed to cover the $n^+$-type drain area 103 formed on the back side of the $n^+$-type SiC substrate 101. Next, an electrode for drain wiring 116 is formed to cover the metal silicide layer 115. The electrode for drain wiring 116 is formed by laminating a Ti film, an Ni film and a gold (Au) film by 0.5 to 1 µm in total.

Afterward, external wiring is respectively electrically connected to the electrode for source wiring 2, the electrode for gate wiring 8 and the electrode for drain wiring 116.

As described above, according to the second embodiment, since the area of the gate electrode 111 on the chip is formed more largely, compared with that in the first embodiment, realizing the lower-loss and more reliable silicon carbide semiconductor device than normal DMOS structure and its manufacturing method as in the first embodiment, gate resistance can be reduced. Accordingly, further high-speed switching is enabled.

Third Embodiment

Figure 32:
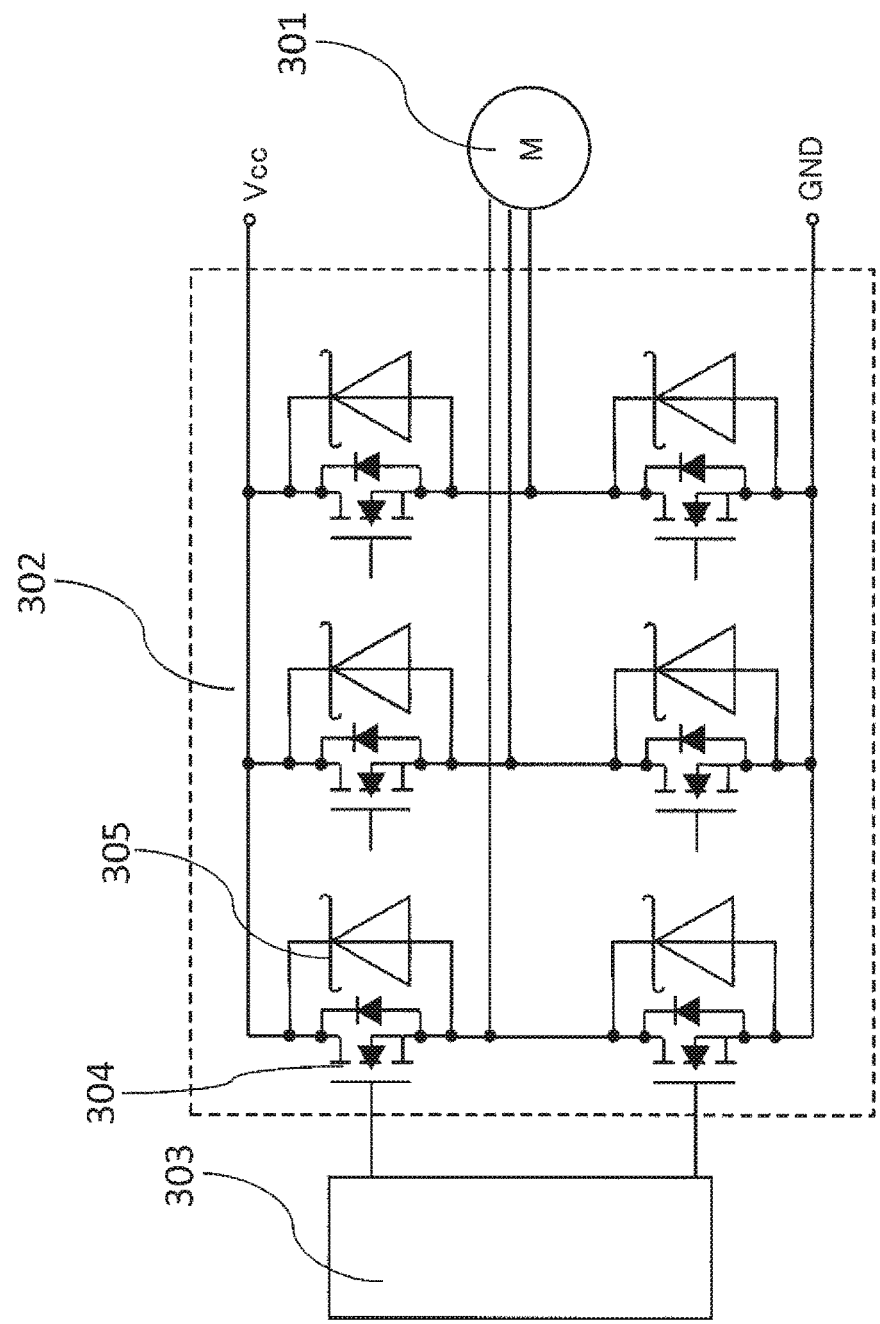
FIG. 32 is a circuit diagram showing a power converter (an inverter) mounting the first embodiment or the second embodiment in a third embodiment of the present invention.

The semiconductor device provided with the SiC MISFETs described in the first embodiment and the semiconductor device provided with the SiC MISFETs described in the second embodiment can be used for a power converter. Referring to FIG. 32, a power converter in a third embodiment will be described below. FIG. 32 is a circuit diagram showing one example of the power converter (the inverter) in the third embodiment.

As shown in FIG. 32, an inverter module 302 is provided with an SiC MISFET 304 which is a switching device and a diode 305. In each single phase, the SiC MISFET 304 and the diode 305 are connected in antiparallel between supply voltage (Vcc) and input potential of a load (for example, a motor) 301 (an upper arm), and the SiC MISFET 304 and the diode 305 are also connected in antiparallel between input potential of the load 301 and ground potential (GND) (a lower arm). That is, in each single phase, the two SiC MISFETs 304 and the two diodes 305 are provided to the load 301 and in three phases, the six switching devices 304 and the six diodes 305 are provided. A control circuit 303 is connected to a gate electrode to the individual SiC MISFET 304 and the SiC MISFET 304 is controlled by the control circuit 303. Accordingly, the load 301 can be driven by controlling current flowing in the SiC MISFET 304 configuring the inverter module 302 by the control circuit 303.

The functions of the SiC MISFET 304 configuring the inverter module 302 will be described below. To control and drive the load 301 such as the motor, a sine wave of desired voltage is required to be input to the load 301. The control circuit 303 controls the SiC MISFET 304 and performs pulse width modulation operation for dynamically modulating pulse width of a rectangular wave. An output rectangular wave is smoothed via an inductor and a pseudo desired sinewave is acquired. The SiC MISFET 304 is provided with a function for producing a rectangular wave for the pulse width modulation operation.

As described above, according to the third embodiment, the SiC MISFET 304 can endow the power converter such as the inverter with high performance by using the semiconductor device described in the first embodiment or in the second embodiment for the SiC MISFET 304 corresponding to high performance which the SiC MISFET 304 has. Further, since the SiC MISFET 304 has long-term reliability, a life cycle of the power converter such as the inverter can be extended for a long term.

Moreover, the power converter in this embodiment can be used for a three-phase motor system. The load 301 shown in FIG. 32 is a three-phase motor, and the high performance and the long-term life cycle of the three-phase motor system can be realized by providing the semiconductor device described in the first embodiment or in the second embodiment to the inverter module 302.

Fourth Embodiment

Figure 33:
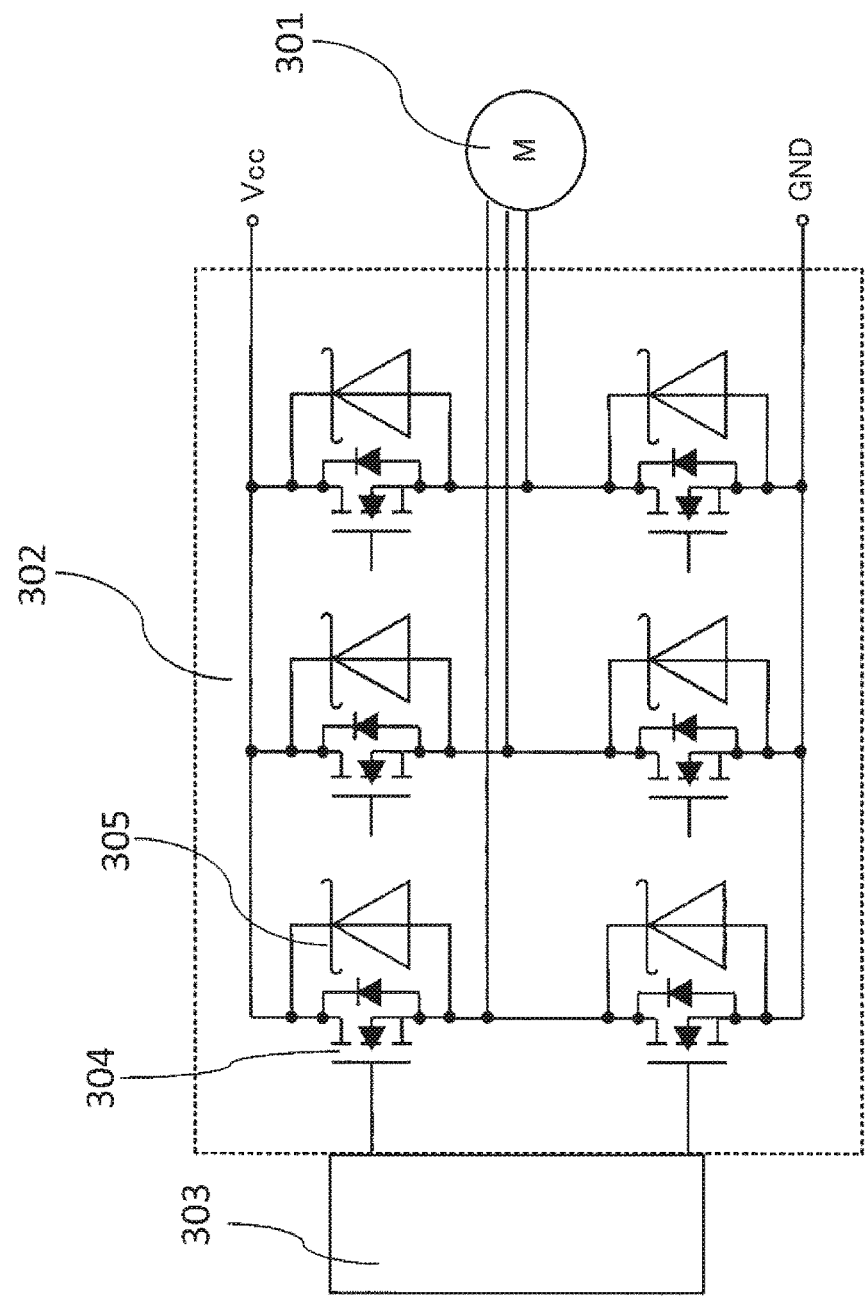
FIG. 33 is a circuit diagram showing a power converter (an inverter) mounting the first embodiment or the second embodiment in a fourth embodiment of the present invention.

The semiconductor device provided with the SiC MISFET described in the first embodiment and the semiconductor device provided with the SiC MISFET described in the second embodiment can be used for a power converter. Referring to FIG. 33, a power converter in a fourth embodiment will be described below. FIG. 33 is a circuit diagram showing one example of the power converter (the inverter) in the fourth embodiment.

As shown in FIG. 33, an inverter module 302 is provided with an SiC MISFET 304 which is a switching device and a diode 305. In each single phase, the SiC MISFET 304 and the diode 305 are connected between supply voltage (Vcc) and input potential of a load (for example, a motor) 301 in antiparallel (an upper arm), and the SiC MISFET 304 and the diode 305 are also connected between input potential of the load 301 and ground potential (GND) in antiparallel (a lower arm). That is, in each single phase, the two SiC MISFETs 304 and the two diodes 305 are provided to the load 301 and in three phases, the six switching devices 304 and the six diodes 305 are provided. A control circuit 303 is connected to a gate electrode of the individual SiC MISFET 304 and the SiC MISFET 304 is controlled by the control circuit 303. Accordingly, the load 301 can be driven by controlling current flowing in the SiC MISFET 304 configuring the inverter module 302 by the control circuit 303.

Functions of the SiC MISFET 304 configuring the inverter module 302 will be described below. The SiC MISFETs 304 described in the first embodiment and in the second embodiment can acquire higher current density than that of normal DMOS. Accordingly, even if the difference (a gate overdrive amount) between applied gate voltage and threshold voltage is small, sufficiently high current can be acquired. Therefore, a gate overdrive amount required for driving can be reduced, and the gate driving circuit 303 can be connected to a single power source. That is, no dc voltage converter is required, the gate driving circuit 303 is compacted, and the fourth embodiment in which the gate driving circuit is directly connected to the inverter module 302 can be provided. The electromechanically integrated compact system can be provided by using the fourth embodiment.

Fifth Embodiment

Figure 34:
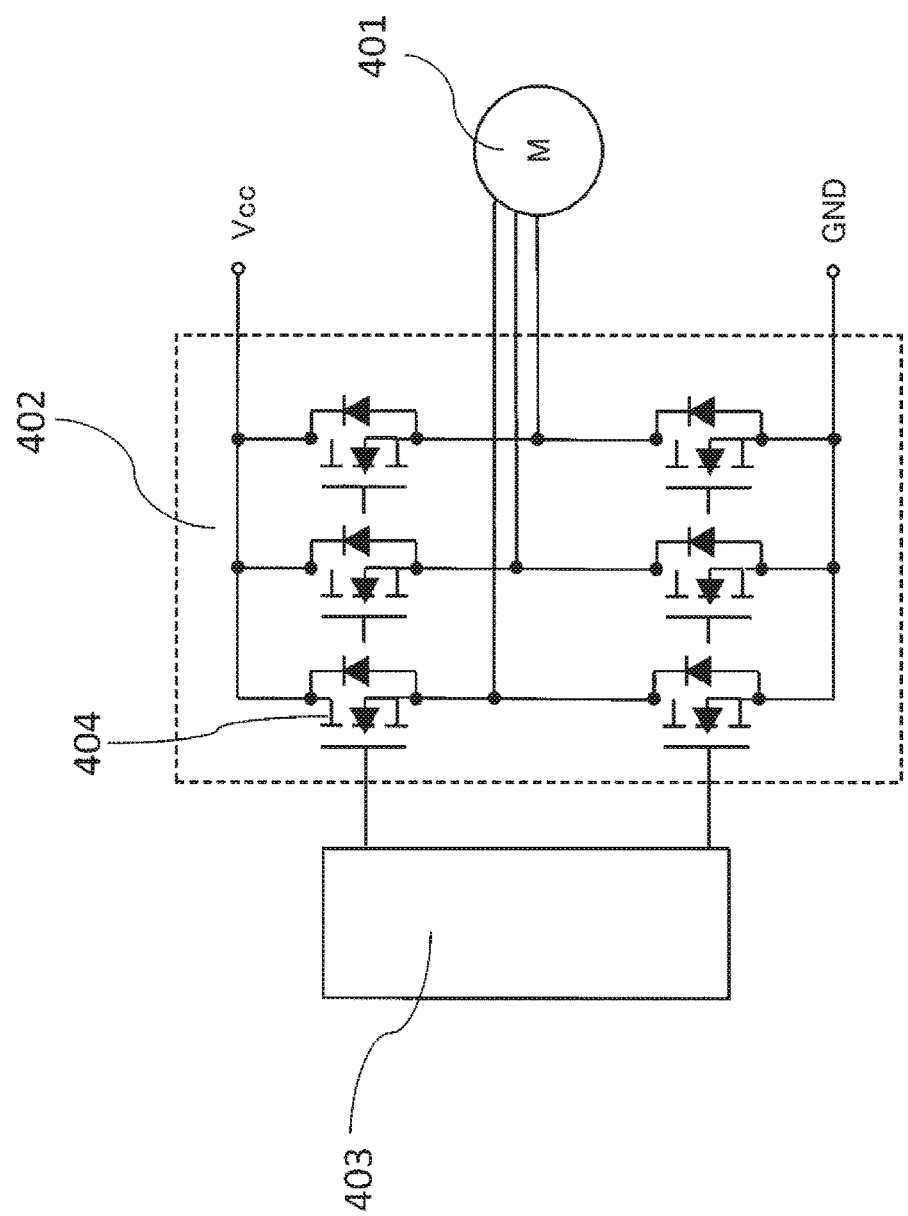
FIG. 34 is a circuit diagram showing a power converter (an inverter) mounting the first embodiment or the second embodiment in a fifth embodiment of the present invention.

The semiconductor device provided with the SiC MISFET described in the first embodiment and the semiconductor device provided with the SiC MISFET described in the second embodiment can be used for a power converter. Referring to FIG. 34, a power converter in a fifth embodiment will be described below. FIG. 34 is a circuit diagram showing one example of the power converter (the inverter) in the fifth embodiment.

As shown in FIG. 34, an inverter module 402 is provided with SiC MISFET 404 which is a switching device. In each single phase, the SiC MISFET 404 is connected between supply voltage (Vcc) and input potential of a load (for example, a motor) 401 (an upper arm) and the SiC MISFET 404 is also connected between input potential of the load 401 and ground potential (GND) (a lower arm). That is, in each single phase, the two SiC MISFETs 404 are provided to the load 401 and in three phases, the six switching devices 404 are provided. A control circuit 403 is connected to a gate electrode of the individual SiC MISFET 404 and the SiC MISFET 404 is controlled by the control circuit 403. Accordingly, the load 401 can be driven by controlling current flowing in the SiC MISFET 404 configuring the inverter module 402 by the control circuit 403.

Functions of the SiC MISFET 404 configuring the inverter module 402 will be described below. For one of the functions of the SiC MISFET 404, the function for producing a rectangular wave for performing pulse width modulation operation as in the third embodiment can be given. Further, the SiC MISFET 404 also functions as the diode 305 in the third embodiment. In the inverter module 402, when the SiC MISFET 404 is turned off in a case where an inductance coil is included in the load 401 such as a motor, energy stored in the inductance coil is necessarily required to be discharged (reflux current). In the third embodiment, the diode 305 plays this role. In the meantime, in the fifth embodiment, the SiC MISFET 404 plays this role. That is, synchronous rectification drive is used in the fifth embodiment. The synchronous rectification drive means a method of turning on a gate of the SiC MISFET 404 in reflux and reversely conducting the SiC MISFET 404.

Accordingly, conduction loss in reflux is determined by not a property of the diode but a property of the SiC MISFET 404. Further, when synchronous rectification drive is performed, dead time in which the upper and lower SiC MISFETs are both turned off is required to prevent the upper and lower arms from being short-circuited. A built-in PN diode formed by a drift layer and a p-type body layer of the SiC MISFET 404 is driven during the dead time. The travel distance of a carrier in SiC is shorter than that in Si and loss during dead time is small. For example, the travel distance is similar to that in a case where the diode 305 in the third embodiment is formed by an SiC Schottky barrier diode.

As described above, according to the fifth embodiment, loss in reflux can also be reduced corresponding to high performance of the SiC MISFET 404 for example by using the semiconductor device described in the first embodiment or in the second embodiment for the SiC MISFET 404. Further, since no diode is used, the power converter such as an inverter can be compacted. Further, since the SiC MISFET 404 has long-term reliability, a life cycle of the power converter such as an inverter can be extended.

Moreover, the power converter in the fifth embodiment can be used for a three-phase motor system. The load 401 shown in FIG. 34 is a three-phase motor, and high performance and extension of the life cycle of the three-phase motor system can be realized by providing the semiconductor device described in the first embodiment or in the second embodiment to the inverter module 402.

Further, in the fifth embodiment, the gate driving circuit 403 can also be directly connected to the inverter module 402 as in the fourth embodiment. Accordingly, the fifth embodiment is also suitable for an electromechanically integrated compact system.

Sixth Embodiment

Figure 35:
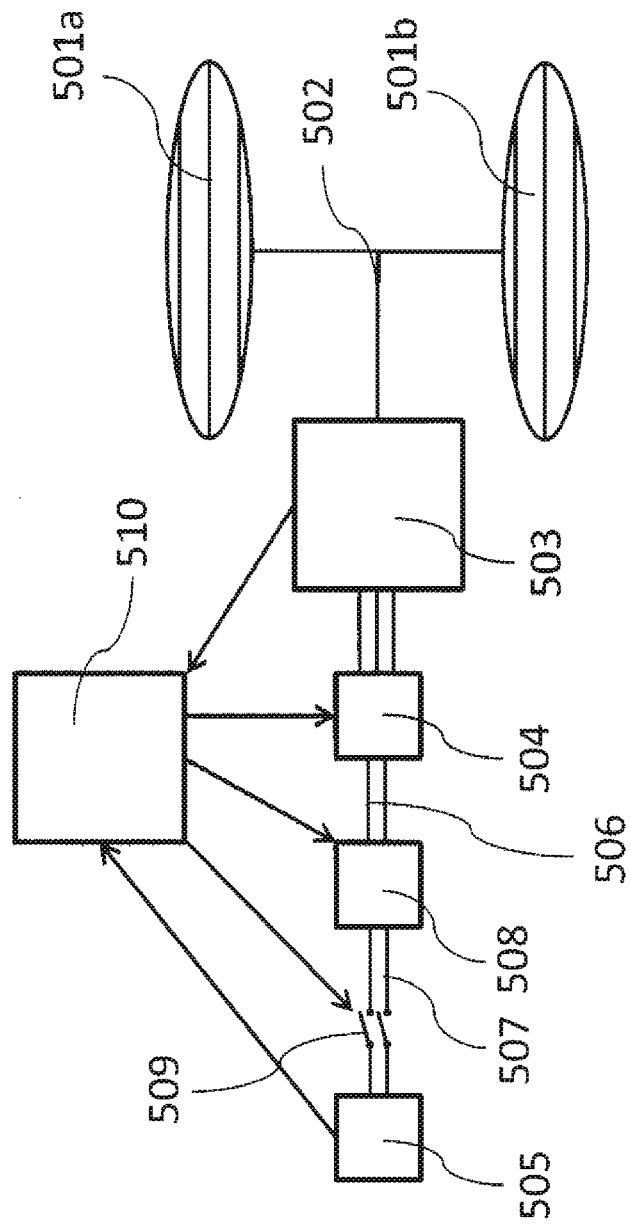
FIG. 35 is a block diagram showing an electric vehicle mounting the first embodiment or the second embodiment in a sixth embodiment of the present invention.
Figure 36:
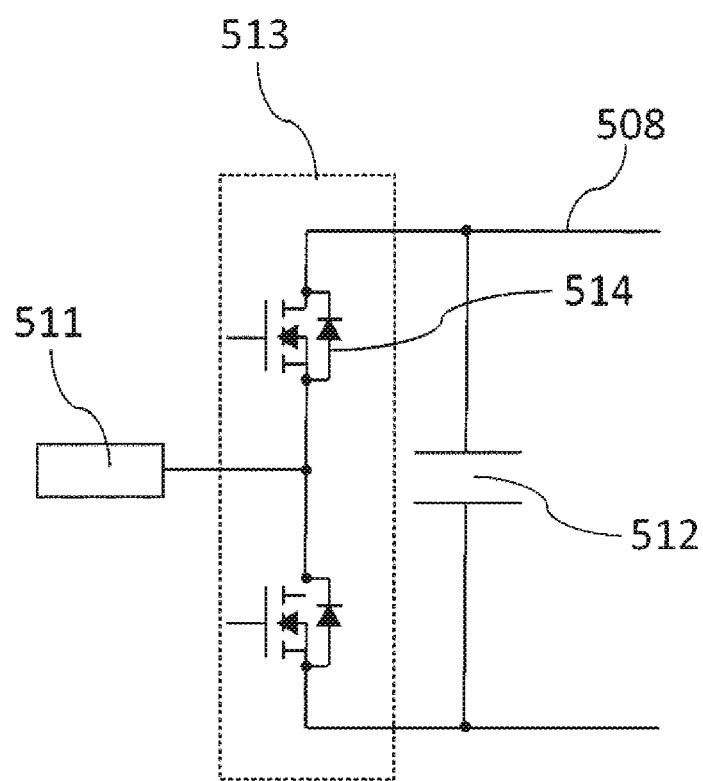
FIG. 36 is a circuit diagram showing a boost converter mounting the first embodiment or the second embodiment in a seventh embodiment of the present invention.

The three-phase motor system described in the third embodiment, in the fourth embodiment or in the fifth embodiment can be used for an automobile such as a hybrid vehicle, an electric vehicle and a fuel cell electric vehicle. Referring to FIGS. 35 and 36, an automobile using a three-phase motor system in a sixth embodiment will be described below. FIG. 35 is a schematic diagram showing one example of a configuration of an electric vehicle in the sixth embodiment and FIG. 36 is a circuit diagram showing one example of a boost converter in the sixth embodiment.

As shown in FIG. 35, the electric vehicle is provided with a three-phase motor 503 enabling input/output of power to/from a driving shaft 502 respectively connected to a driving wheel 501a and a driving wheel 501b, an inverter 504 for driving the three-phase motor 503 and a battery 505. Further, the electric vehicle is provided with the boost converter 508, a relay 509 and an electronic control unit 510, and the boost converter 508 is connected to a power line 506 connected to the inverter 504 and a power line 507 connected to the battery 505.

The three-phase motor 503 is a synchronous generator-motor provided with a rotor in which a permanent magnet is buried and a stator onto which a three-phase coil is wound. For the inverter 504, the inverter described in the third embodiment, in the fourth embodiment or in the fifth embodiment can be used.

The boost converter 508 has a configuration that a reactor 511 and a smoothing capacitor 512 are connected to an inverter 513 as shown in FIG. 36. The inverter 513 is similar to the inverter described in the fifth embodiment for example and device configuration in the inverter is also similar. In the sixth embodiment, as in the fifth embodiment for example, the inverter 513 is configured by SiC MISFETs 514 as shown in FIG. 36.

The electronic control unit 510 shown in FIG. 35 is provided with a microprocessor, a storage device and an input-output port, and the electronic control unit receives a signal from a sensor detecting a rotor position of the three-phase motor 503 or a charge/discharge value of the battery 505. The electronic control unit 510 outputs a signal for controlling the inverter 504, the boost converter 508 and the relay 509.

As described above, according to the sixth embodiment, for the inverter 504 and the boost converter 508 which are respectively a power converter, the power converter described in the third embodiment, in the fourth embodiment and in the fifth embodiment can be used. Further, for the three-phase motor system configured by the three-phase motor 503, the inverter 504 and others, the three-phase motor system described in the third embodiment, in the fourth embodiment or in the fifth embodiment can be used. Hereby, energy saving, miniaturization, light weight and space saving of the electric vehicle can be realized.

In the sixth embodiment, the electric vehicle has been described. However, the three-phase motor system in the abovementioned each embodiment can also be similarly applied to a hybrid vehicle also using an engine and a fuel cell electric vehicle including the battery 505 configured by fuel cell stacks.

Seventh Embodiment

Figure 37:
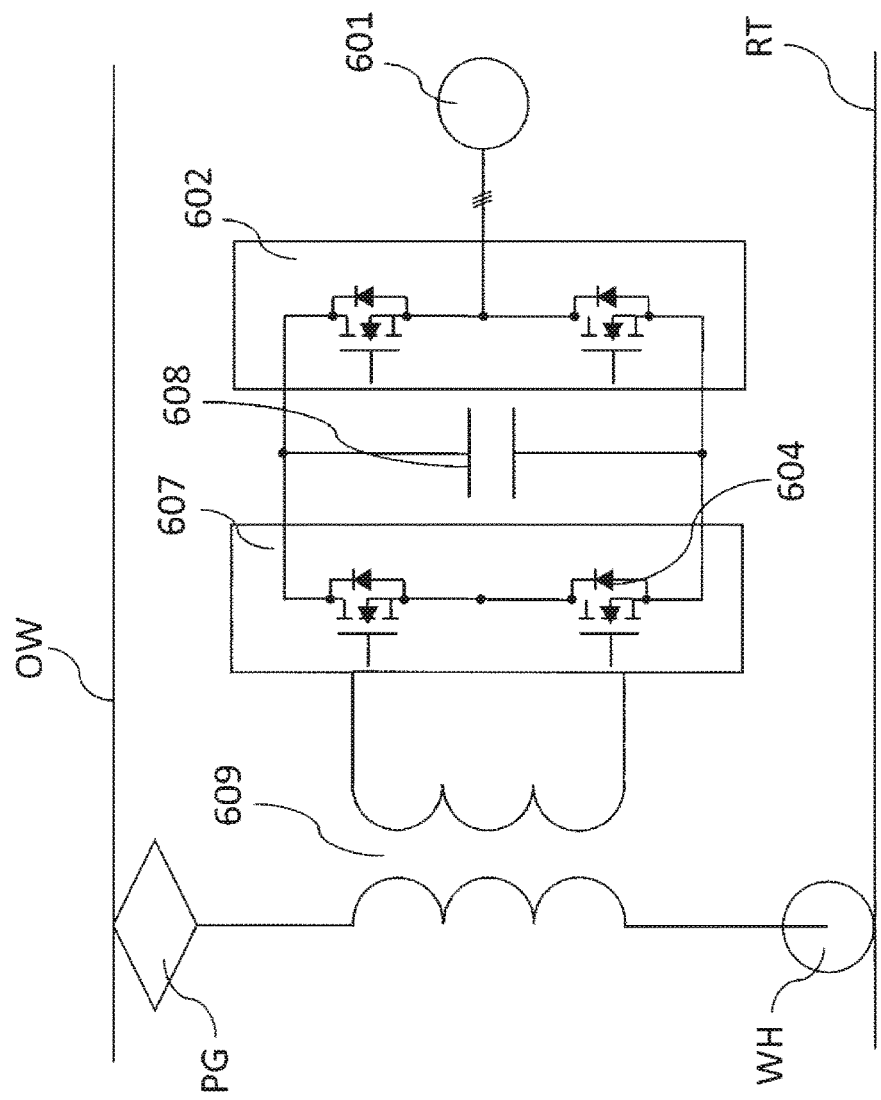
FIG. 37 is a block diagram showing a railway vehicle mounting the first embodiment or the second embodiment in an eighth embodiment of the present invention.

The three-phase motor systems described in the third embodiment, in the fourth embodiment and in the fifth embodiment can be used for a railway vehicle. Referring to FIG. 37, a railway vehicle using a three-phase motor system in a seventh embodiment will be described below. FIG. 37 is a circuit diagram showing one example of a converter and an inverter respectively provided to the railway vehicle in the seventh embodiment.

As shown in FIG. 37, electric power is supplied to the railway vehicle via a pantograph PG from an overhead power line (OW) (for example, 25 kV). Voltage is dropped up to 1.5 kV via a transformer 609 and alternating current is converted to direct current by the converter 607. Further, direct current is converted to alternating current by the inverter 602 via a capacitor 608 and a three-phase motor which is a load 601 is driven. For device configuration in the converter 607, both SiC MISFETs and diodes may also be used as in the third embodiment and only SiC MISFETs may also be used as in the fifth embodiment. In the seventh embodiment, the converter is configured by SiC MISFETs 604 as in the fifth embodiment for example as shown in FIG. 37. In FIG. 37, the control circuit described in the third embodiment, in the fourth embodiment or in the fifth embodiment is omitted. A reference numeral RT in FIG. 37 denotes a roadway and WH denotes a wheel.

As described above, according to the seventh embodiment, the power converter in the third embodiment, in the fourth embodiment or in the fifth embodiment can be used for the converter 607. Further, for the three-phase motor system configured by the load 601, the inverter 602 and a control circuit, the three-phase motor system described in the third embodiment, in the fourth embodiment or in the fifth embodiment can be used. Hereby, energy saving, miniaturization of underfloor parts and light weight of the railway vehicle can be realized.

The present invention made by inventors has been concretely described on the basis of the embodiments. However, it need scarcely be said that the present invention is not limited to the abovementioned embodiments and the present invention can be variously modified in a scope undeviating from its subject matter.

For example, it need scarcely be said that materials of each part, a conductive type, a manufacturing condition and others are not limited by the description of the abovementioned embodiments and each many variations are allowed. For the convenience of description, conductive types of the semiconductor substrates and the semiconductor films are fixed. However, the present invention is not limited to the conductive types described in the abovementioned embodiments.

LIST OF REFERENCE SIGNS

1: Semiconductor chip, 2: Electrode for source wiring (SiC power MISFET forming area, device forming area), 3: p-type floating field limiting ring, 4: $n^{++}$-type guard ring, 5: Gate opening, 6: SiC power MISFET, 7: Source opening, 8: Electrode for gate wiring, 101: $n^+$-type SiC substrate (substrate), 102: $n^-$-type epitaxial layer, 103: $n^+$-type drain area, 104: SiC epitaxial substrate, 105: p-type body layer (well area), 106: $p^{++}$-type body layer electric potential fixing area, 107: $n^{++}$-type source area, 108-A: $n^+$-type current diffused area, 108-B: $p^+$-type gate insulating film protective area, 109: Trench, 110: Gate insulating film, 111: Gate electrode, 117: n-type high-concentration JFET layer.

The invention claimed is:
1. A semiconductor device, comprising:
a semiconductor substrate having a first conductive type and a first impurity concentration;
a backside electrode formed on a back side of the semiconductor substrate;
a first layer of the first conductive type formed on a surface side of the semiconductor substrate and having a lower second impurity concentration than the first impurity concentration;
a source area of the first conductive type;
a second layer of the first conductive type having a third impurity concentration which is higher than the first impurity concentration;

a well area of a second conductive type reverse to the first conductive type and being in contact with the source area and the second layer;
a plurality of trenches each of which pierces the source area, the well area and the second layer, each said trench being shallower than the well area, and having a bottom which is in contact with the well area;
a third layer of the first conductive type formed up to a deeper position than a boundary between the source area and the well area, electrically connecting the first layer with the source area, and having a higher impurity concentration than the first layer;
an insulating film formed on an inner wall of the trench; and
a gate electrode formed on the insulating film,
wherein said plurality of trenches extends longitudinally in parallel from both sides of said third layer.

2. The semiconductor device according to claim 1, wherein a fourth layer of the second conductive type is formed between the third layer and the insulating film.

3. The semiconductor device according to claim 2, wherein the fourth layer is extended from the well area.

4. The semiconductor device according to claim 1, wherein an impurity concentration of the source area is higher than the impurity concentration of the third layer.

5. The semiconductor device according to claim 1, wherein the semiconductor substrate is made of silicon carbide.

6. A power converter, comprising the semiconductor device according to claim 1 as a switching device.

7. A three-phase motor system provided with functions for:
converting DC power to AC power by the power converter according to claim 6; and
driving a three-phase motor.

8. An automobile, wherein its wheels are driven by the three-phase motor system according to claim 7.

9. A railway vehicle, wherein its wheels are driven by the three phase motor system according to claim 7.

10. A semiconductor device, comprising:
a semiconductor substrate of a first conductive type;
a drain electrode formed on a back side of the semiconductor substrate;
a drift layer of the first conductive type formed on a surface side of the semiconductor substrate;
a source area of the first conductive type;
a current diffused layer of the first conductive type;
a body layer of a second conductive type reverse to the first conductive type in contact with the source area and the current diffused layer;
a plurality of trenches each of which pierces the source area, the body layer and the current diffused layer, each said trench being shallower than the body layer, and having a bottom which is in contact with the body layer;
a high-concentration Junction Field Effect Transistor (JFET) layer of the first conductive type formed up to a deeper position than a boundary between the current diffused layer and the body layer, electrically connecting the drift layer and the current diffused layer, and having a higher impurity concentration than the drift layer;
a gate insulating film formed on an inner wall of the trench; and
a gate electrode formed on the gate insulating film,
wherein said plurality of trenches extends longitudinally in parallel from both sides of said high-concentration JFET layer.

11. The semiconductor device according to claim 10, wherein a gate insulating film protective layer of the second conductive type is formed between the high-concentration JFET layer and the gate insulating film.

12. The semiconductor device according to claim 11, wherein the gate insulating film protective layer is extended from the body layer.

13. The semiconductor device according to claim 10, wherein an impurity concentration of the current diffused layer is higher than the impurity concentration of the high-concentration JFET layer.

14. The semiconductor device according to claim 10, wherein the semiconductor substrate is made of silicon carbide.

15. A manufacturing method of a semiconductor device, comprising steps of:
preparing a semiconductor substrate including a first conductive type epitaxial layer having a first impurity concentration;
forming a first layer of a second conductive type reverse to the first conductive type in the epitaxial layer;
forming a source area of the first conductive type in the first layer;
forming a second layer of the first conductive type having an interval between the second layer and the source area in the epitaxial layer using a first mask;
forming a well area of the first conductive type having a second impurity concentration different from the first impurity concentration up to a deeper area than a formed depth of the second layer in the epitaxial layer using a second mask having an opening overlapped with an opening of the first mask;
forming a plurality of trenches each piercing the source area, the first layer and the second layer;
forming an insulating film on an inner wall of the trench; and
forming a gate electrode on the insulating film,
wherein said plurality of trenches extends longitudinally in parallel from both sides of said gate electrode.

* * * * *